(12) United States Patent
Park et al.

(10) Patent No.: US 10,862,072 B2
(45) Date of Patent: Dec. 8, 2020

(54) DISPLAY DEVICE

(71) Applicant: LG Display Co., Ltd., Seoul (KR)

(72) Inventors: Eun-Jung Park, Goyang-si (KR);
Kwan-Soo Kim, Paju-si (KR);
Seok-Hyun Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/402,024

(22) Filed: May 2, 2019

(65) Prior Publication Data

US 2019/0372057 A1 Dec. 5, 2019

(30) Foreign Application Priority Data

May 29, 2018 (KR) .................. 10-2018-0061350

(51) Int. Cl.
*H01L 51/52* (2006.01)
*H01L 27/32* (2006.01)

(52) U.S. Cl.
CPC ........ *H01L 51/5278* (2013.01); *H01L 27/322* (2013.01); *H01L 27/3244* (2013.01); *H01L 51/5215* (2013.01); *H01L 51/5218* (2013.01); *H01L 51/5234* (2013.01); *H01L 2251/5323* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 9,634,075 B2 | 4/2017 | Chung et al. | |
| 2011/0205198 A1* | 8/2011 | Jeong | H01L 27/326 345/205 |
| 2012/0169683 A1* | 7/2012 | Hong | H01L 27/326 345/206 |
| 2013/0113843 A1 | 5/2013 | Yamazaki | |
| 2013/0187131 A1* | 7/2013 | Chung | H01L 27/326 257/40 |
| 2014/0183482 A1 | 7/2014 | Lee et al. | |
| 2015/0048335 A1* | 2/2015 | Chung | H01L 27/3267 257/40 |
| 2015/0357382 A1 | 12/2015 | Chung et al. | |
| 2017/0084881 A1* | 3/2017 | Choi | H01L 51/56 |
| 2017/0200778 A1 | 7/2017 | Jeon et al. | |
| 2017/0271415 A1 | 9/2017 | Yamazaki | |

FOREIGN PATENT DOCUMENTS

| | | |
|---|---|---|
| JP | 2011-175962 A | 9/2011 |
| JP | 2013-117719 A | 6/2013 |
| JP | 2013-149971 A | 8/2013 |

OTHER PUBLICATIONS

European Patent Office, Extended European Search Report and Opinion, EP Patent Application No. 19176456.2, dated Nov. 11, 2019, nine pages.
Japan Patent Office, Notice of Reasons for Rejection, JP Patent Application No. 2019-099914, dated Jun. 30, 2020, 17 pages.

* cited by examiner

*Primary Examiner* — Dung A. Le

(74) *Attorney, Agent, or Firm* — Fenwick & West LLP

(57) ABSTRACT

A display device enables transparent display at increased transparency and double-sided emission display, thereby being capable of improving aperture ratio during emission. The display device includes a transmission part having a configuration capable of selectively achieving a transmission function and a double-sided emission function.

19 Claims, 24 Drawing Sheets

US 10,862,072 B2

DISPLAY DEVICE

CROSS-REFERENCE TO RELATED APPLICATIONS

This application claims the benefit of Republic of Korea Patent Application No. 10-2018-0061350, filed on May 29, 2018, which is hereby incorporated by reference as if fully set forth herein.

BACKGROUND OF THE INVENTION

Field of the Invention

The present invention relates to a display device enabling transparent display, and more particularly to a display device simultaneously enabling transparent display and double-sided emission display, thereby being capable of improving transparency, aperture ratio and device performance.

Discussion of the Related Art

In recent years, with the advent of the information age, the field of displays to visually express electrical information signals has rapidly developed. As such, a variety of flat display devices having superior properties such as slimness, lightness and low power consumption have rapidly been developed as replacements for existing cathode ray tubes (CRTs).

Representative examples of such flat display devices may include liquid crystal display (LCD) devices, plasma display panel (PDP) devices, field emission display (FED) devices, organic light emitting display (OLED) devices, quantum dot display devices, and the like.

Among these displays, self-luminous display devices such as OLED devices or quantum dot display devices are considered an application having competitiveness in that they do not require a separate light source while achieving compactness and distinct color display.

Recently, there has been increased demand for a transparent display device capable of achieving transmission of light at both the front and rear sides thereof and displaying an image without obscuring the user's view.

In addition, research is being conducted to simultaneously achieve the above-mentioned self-luminous display and transparent display through modification of arrangement of light emitting diodes.

However, the region for self-luminous display, namely, a self-luminous region, and the region for transparent display, namely, a transparent region, preferentially take into consideration an enhancement in light emission efficiency and an enhancement in transmissivity, respectively, and, as such, have different purposes. For this reason, structures respectively required for the self-luminous region and the transparent region differ from each other and, as such, it may be difficult to embody those structures through a common fabrication process.

Furthermore, in the case in which both the self-luminous region and the transparent region are provided on a substrate, it may be necessary to eliminate, from the transparent region, a configuration corresponding to that of the self-luminous region when an increase in transmissivity is required, and, as such, there may be a problem in that the self-luminous region may be reduced by an increased portion of the transparent region. Furthermore, there may be a problem in that an excessively high voltage is required for emission display at a desired brightness or higher through only the reduced self-luminous region.

SUMMARY OF THE INVENTION

Accordingly, the present invention is directed to a display device that substantially obviates one or more problems due to limitations and disadvantages of the related art.

An object of the present invention is to provide a display device simultaneously enabling transparent display and double-sided emission display, thereby being capable of improving transparency, aperture ratio and device performance.

Another object of the present invention is to provide a display device configured to enable transparent display, in which an organic light emitting configuration is provided at a transparent region, to enable light emission even in the transparent region, thereby being capable of reducing the drive voltage required for light emission driving in accordance with an increased emission region, thereby achieving an increase in the lifespan of the display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device having an emission part and a transmission part includes a transparent substrate, a reflective anode on the transparent substrate in the emission part, a transparent anode on the transparent substrate in the transmission part, a first light emitting layer arranged on the reflective anode in the emission part, a second light emitting layer arranged on the transparent anode in the transmission part, and a cathode arranged on both the first light emitting layer and the second light emitting layer.

The display device may further include a first thin film transistor arranged outside the transparent part while being electrically connected to the reflective anode, and a second thin film transistor arranged outside the transparent part while being electrically connected to the transparent anode.

The display device may further include a first organic stack associated with the emission part and including the first light emitting layer between the reflective anode and the cathode, and a second organic stack associated with the transmission part and including the second light emitting layer between the transparent anode and the cathode. The second organic stack may include an optical compensation layer. As a result, the second organic stack may be taller in height than the first organic stack.

Each of the first and second organic stacks may include at least two sub-stacks separated by a charge generation layer. Each sub-stack of the first organic stack may be provided with the first light emitting layer. Each sub-stack of the second organic stack may be provided with the second light emitting layer.

The optical compensation layer of the second organic stack may contact the second light emitting layer in at least one of the two sub-stacks.

The first and second organic stacks may further include a first common organic layer arranged under each of the first and second light emitting layers of the two sub-stacks in the first and second organic stacks in common, and a second common organic layer arranged over the first and second light emitting layers of the two sub-stacks in common.

The optical compensation layer may be made of the same material as at least one of organic layers included in the first common organic layer or the second common organic layer.

The optical compensation layer of the second organic stack may have a total thickness of 400 Å to 1,200 Å.

The first light emitting layer may include a first-color light emitting layer and a second-color light emitting layer and adapted to emit light of a first wavelength and light of a second wavelength, respectively. The second light emitting layer may include a third-color light emitting layer adapted to emit light of a third wavelength different from the first and second wavelengths.

The first-color and second-color light emitting layers may be alternately arranged while being spaced apart from each other. Each of the first-color and second-color light emitting layers may be surrounded by a plurality of third-color light emitting layers spaced apart from one another.

In this case, the third wavelength may be an intermediate wavelength longer than the first wavelength and shorter than the second wavelength.

Alternatively, the first light emitting layer may include a first-color light emitting layer to emit light of a first wavelength, a second-color light emitting layer to emit light of a second wavelength, and a third-color light emitting layer to emit light of a third wavelength. The second light emitting layer may include a fourth light emitting layer adapted to emit light of the third wavelength. The third wavelength may be longer than the first wavelength and shorter than the second wavelength. The third-color light emitting layer and the fourth-color light emitting layer may be electrically coupled to a same thin film transistor The first-color to third-color light emitting layers may be spaced apart from one another. The fourth-color light emitting layer may be surrounded by the first-color to third-color light emitting layers under a condition that the first-color to third-color light emitting layers are spaced apart from the fourth-color light emitting layer.

The third-color light emitting layer may occupy a largest area in the emission part.

The first wavelength may be 430 nm to 490 nm, the third wavelength may be 510 nm to 590 nm, and the second wavelength may be 600 nm to 650 nm.

The cathode may include a plurality of layers, and the layer nearest to the first and second organic stacks, among the layers, may contain an inorganic compound.

The cathode may include a metal alloy layer exhibiting a transmittance of 70% or more at a wavelength of 520 nm.

The transparent anode may include a layered structure having a first transparent electrode layer and a second transparent electrode layer, and the reflective anode may be in contact with a third transparent electrode layer and a fourth transparent electrode layer arranged respectively under and over the reflective anode of the emission part.

The display device may further include a color filter layer in the emission part and arranged over the cathode, to transmit light from the first light emitting layer.

In still another embodiment, a display device comprises a transparent substrate; a first light emitting element on the transparent substrate, the first light emitting element including a reflective electrode and a first light emitting layer on the reflective electrode; and a second light emitting element on the transparent substrate, the second light emitting element including a transparent electrode and a second light emitting layer on the transparent electrode.

In some embodiments, the display device may further include a first transistor disposed on the transparent substrate so as not to overlap with the transparent electrode of the second light emitting element, the first transistor electrically connected to the first light emitting element; and a second thin film transistor disposed on the transparent substrate so as not to overlap with the transparent electrode of the second light emitting element, the second transistor electrically connected to the second light emitting element. Both the first transistor and the second transistor may be disposed under and overlaps with the reflective anode of the first light emitting element. The second transistor may also be disposed under a bank separating the first light emitting element and the second light emitting element.

In some embodiments, both the first light emitting element and the second light emitting element further include a common electrode common to both the first light emitting element and the second light emitting element. The display device may further comprise a first organic stack between the reflective electrode and the common electrode and including the first light emitting layer; and a second organic stack between the transparent electrode and the common electrode and including the second light emitting layer; and the second organic stack comprises an optical compensation layer, the second organic stack being taller in height than the first organic stack. Each of the first and second organic stacks comprises at least two sub-stacks separated by a charge generation layer, each sub-stack of the first organic stack is provided with the first light emitting layer, and each sub-stack of the second organic stack is provided with the second light emitting layer. In some embodiments, the optical compensation layer of the second organic stack contacts the second light emitting layer in at least one of the two sub-stacks.

The first and second organic stacks may further comprise: a first common organic layer under each of the first and second light emitting layers of the two sub-stacks in the first and second organic stacks in common; and a second common organic layer over the first and second light emitting layers of the two sub-stacks in the first and second organic stacks in common.

The optical compensation layer may comprise the same material as at least one of organic layers included in the first common organic layer or the second common organic layer. The optical compensation layer included in the second organic stack may have a total thickness of 400 Å to 1,200 Å.

In some embodiments, the first light emitting layer comprises a first-color light emitting layer to emit light of a first wavelength and a second-color light emitting layer to emit light of a second wavelength; and the second light emitting layer comprises a third-color light emitting layer to emit light of a third wavelength different from the first wavelength and the second wavelength. The first-color and second-color light emitting layers are alternately arranged while being spaced apart from each other; and each of the first-color and second-color light emitting layers is surrounded by a plurality of third-color light emitting layers spaced apart from one another. The third wavelength is longer than the first wavelength and shorter than the second wavelength. The third-color light emitting layer and the fourth-color light emitting layer may be electrically coupled to a same thin film transistor.

In still other embodiments, the first light emitting layer comprises a first-color light emitting layer to emit light of a first wavelength, a second-color light emitting layer to emit light of a second wavelength, and a third-color light emitting layer to emit light of a third wavelength; and the second light emitting layer comprises a fourth color-light emitting layer to emit light of the third wavelength. The third wavelength is longer than the first wavelength and shorter than the second wavelength. The first-color to third-color light emitting layers are spaced apart from one another; and the fourth-color light emitting layer is surrounded by the first-color to third-color light emitting layers and is spaced apart from the first-color to third-color light emitting layers. The third-color light emitting layer occupies a larger area than the first-color light emitting layer and the second-color light emitting layer. The first wavelength is 430 nm to 490 nm, the third wavelength is 510 nm to 590 nm, and the second wavelength is 600 nm to 650 nm.

In some embodiments, the common electrode comprises a plurality of common electrode layers, and a first common electrode layer nearest to the first and second organic stacks, among the common electrode layers, includes an inorganic compound. The common electrode comprises a metal alloy layer exhibiting a transmittance of 70% or more at a wavelength of 520 nm.

In some embodiments, the transparent electrode comprises a layered structure having a first transparent electrode layer and a second transparent electrode layer; and the reflective electrode is in contact with a third transparent electrode layer and a fourth transparent electrode layer arranged respectively under and over the reflective electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Figure 1:
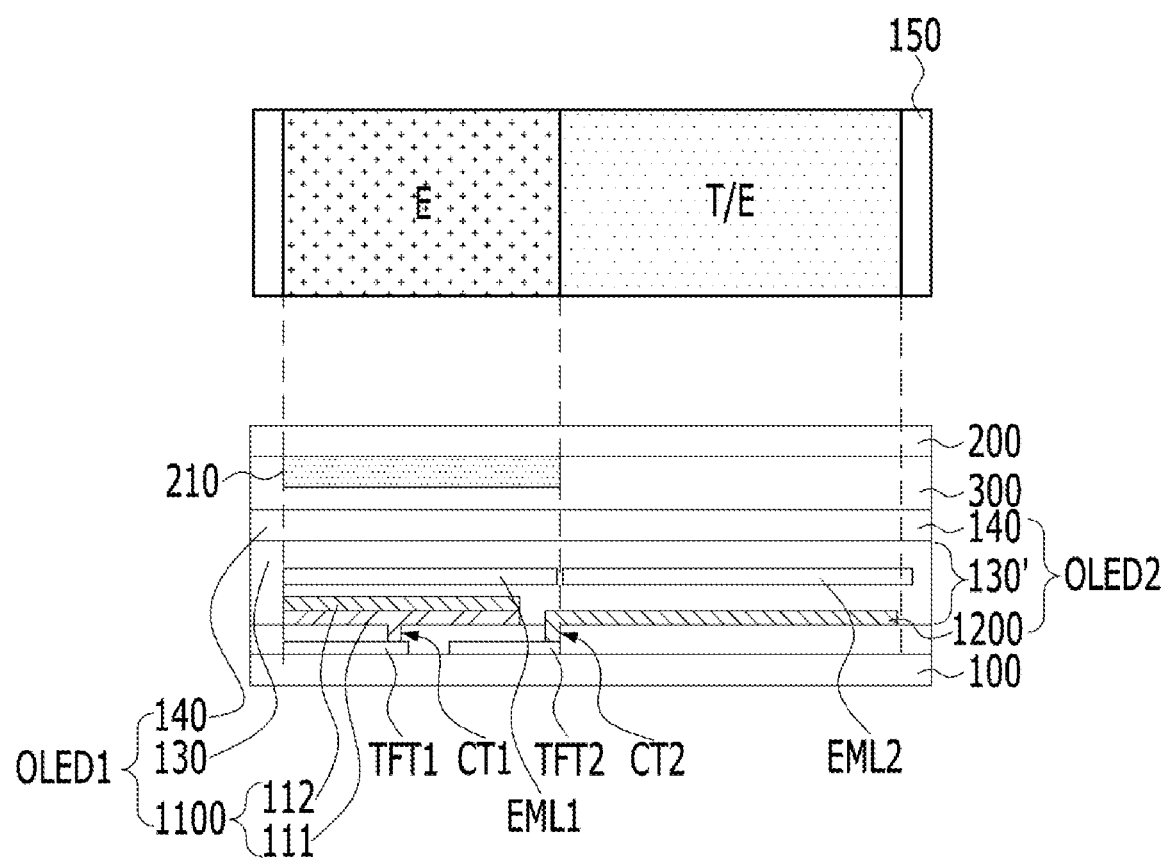
FIG. 1 is a cross-sectional view schematically illustrating emission and transmission parts of a display device according to the present invention.

Hereinafter, preferred embodiments of the present invention will be described in detail with reference to the accompanying drawings. Throughout the disclosure, the same reference numerals designate substantially the same constituent elements. In describing the present invention, moreover, the detailed description will be omitted when a specific description of publicly known technologies to which the invention pertains is judged to obscure the gist of the present invention. In addition, names of constituent elements used in the following description are selected for easy understanding of the present invention, and may differ from names of practical products.

The shape, size, ratio, angle, number and the like shown in the drawings to illustrate the embodiments of the present invention are only for illustration and are not limited to the contents shown in the drawings. Wherever possible, the same reference numbers will be used throughout the drawings to refer to the same or like parts. In the following description, detailed descriptions of technologies or configurations related to the present invention may be omitted so as not to unnecessarily obscure the subject matter of the present invention. When terms such as "including", "having" and "comprising" are used throughout the specification, an additional component may be present, unless "only" is used. A component described in a singular form encompasses components in a plural form unless particularly stated otherwise.

It should be interpreted that the components included in the embodiment of the present invention include an error range, although there is no additional particular description thereof.

In describing a variety of embodiments of the present invention, when terms for location relation such as "on", "above", "under" and "next to" are used, at least one intervening element may be present between two elements unless "right" or "direct" is used.

In describing a variety of embodiments of the present invention, when terms for temporal relation, such as "after", "subsequently", "next" and "before", a non-continuous case may be present, unless "right" or "direct" is used.

In describing a variety of embodiments of the present invention, terms such as "first" and "second" may be used to describe a variety of components, but these terms only aim to distinguish the same or similar components from one another. Accordingly, throughout the specification, a "first" component may be the same as a "second" component within the technical concept of the present invention, unless specifically mentioned otherwise.

The respective features of various embodiments according to the present invention can be partially or entirely joined or combined and technically variably related or operated, and the embodiments can be implemented independently or in combination.

FIG. 1 is a cross-sectional view schematically illustrating emission and transmission parts of a display device according to the present invention.

As illustrated in FIG. 1, the display device of the present invention includes a transparent substrate 100 having an emission part E and a transmission part T/E, a reflective anode 1100 provided at the emission part E, and a transparent anode 1200 provided at the transmission part T/E. The display device also includes a first light emitting layer EML1 formed on the reflective anode 1100, a second light emitting layer EML2 formed on the transparent anode 1200, and a cathode 140 formed on the first light emitting layer EML1 and the second light emitting layer EML2.

The display device of the present invention has a feature in that the display device is embodied to achieve selective light emission not only through the emission part E, but also through the transmission part T/E, thereby achieving an increase in emission efficiency in the entirety thereof. The transmission part T/E is named as such in that the transmission part T/E maintains transparency in a voltage-OFF state. In practice, however, the transmission part T/E of the present invention is used as a transmission part in a voltage-OFF state while being used as an auxiliary emission part performing light emission in a voltage-ON state. That is, the transmission part T/E appears transparent in the voltage-OFF state such that a lower configuration of the transmission part appears transparent, and emits colored light while exhibiting light transmission properties in the voltage-ON state.

Figure 2:
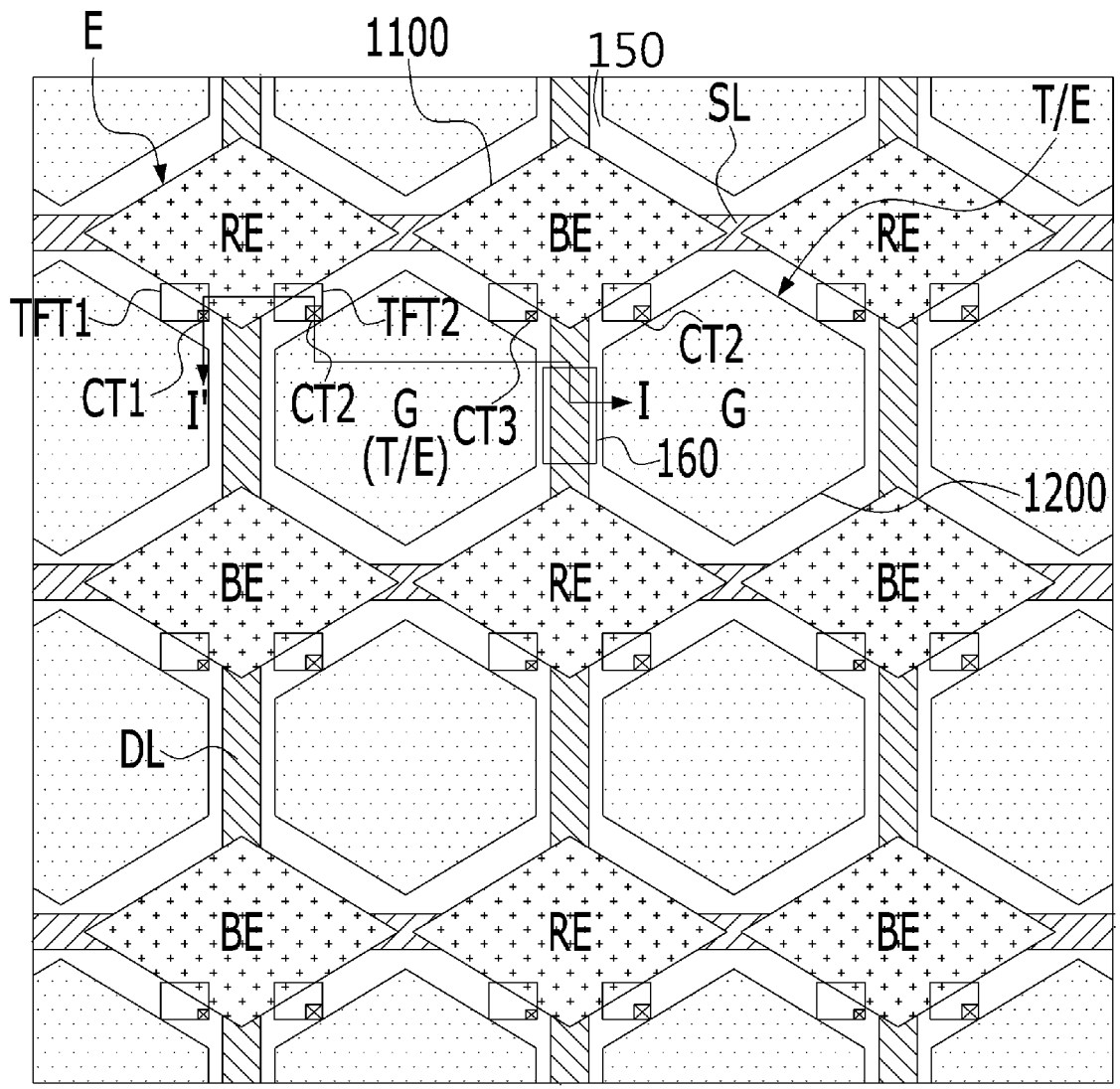
FIG. 2 is a plan view illustrating a pixel configuration of the display device according to the present invention.

A configuration such as a bank 150 may be provided at peripheral portions of the emission and transmission parts E and T/E, to divide adjacent regions of the emission and transmission parts E and T/E from each other. If necessary, the bank 150 may be eliminated. An additional bank 150 may also be provided between the emission part E and the transmission part T/E. In this case, circuit configurations such as thin film transistors TFT1 and TFT2 and lines designated by "SL" and "DL" in FIG. 2 are hidden by the additional bank 150 in order to prevent the circuit configurations from interfering with transparent display.

The emission part E and the transmission part T/E may be spaced apart from each other or in contact with each other when viewed in a plane. When the emission part E and the transmission part T/E are spaced apart from each other, a bank 150 may be provided between the emission part E and the transmission part T/E. Although the bank 150 is not provided, separation between the emission part E and the transmission part T/E may be achieved by separation between the reflective anode 1100 and the transparent anode 1200. As such, the emission part E and the transmission part T/E may be independently driven.

To this end, in the display device of the present invention, the emission part E and the transmission part T/E are configured to have a first organic light emitting element OLED1 and a second organic light emitting element OLED2, respectively.

In addition, as driving configurations for driving the first and second organic light emitting elements OLED1 and OLED2, the emission part E of the transparent substrate 100 may further include a first thin film transistor TFT1 electrically connected to the reflective anode 1100, and a second thin film transistor TFT2 electrically connected to the transparent anode 1200. The reason why the second thin film transistor TFT2 for driving of the transmission part T/E is provided at the emission part E is to maintain transparency of the transmission part T/E.

In this case, when a bank 150 is provided between the emission part E and the transmission part T/E, the first and second thin film transistors TFT1 and TFT2 may be provided not only at the emission part E, but also beneath the bank 150.

The first thin film transistor TFT1 and the second thin film transistor TFT2 are electrically isolated from each other and, as such, apply signals to the reflective anode 1100 and the transparent anode 1200 in an independent manner, respectively.

Meanwhile, the cathode 140 is formed at the emission part E and the transmission part T/E in common without disconnection, using reflective or transmissive metal. The cathode 140 may include a metal alloy layer exhibiting a transmittance of 70% or more at a wavelength of 520 nm in order to allow injection of electrons into the first and second organic light emitting elements OLED1 and OLED2. When the cathode 140 is made of reflective metal, the reflective metal may be an alloy containing at least one of Ag, Mg, and Yb. On the other hand, when the cathode 140 is made of transmissive metal, the cathode 140 is formed using indium zinc oxide (IZO). The thickness of the cathode 140 when the cathode 140 is made of reflective metal and the thickness of the cathode 140 when the cathode 140 is made of transmissive metal may be determined to differ from each other, taking into consideration surface resistance and electron injection.

In this case, the first organic light emitting element OLED1 of the emission part E has a top emission-type structure and, as such, includes the reflective anode 1100, a first organic stack 130, and the cathode 140, which are arranged upwards from the bottom in this order. The second organic light emitting element OLED2 has a multilayer structure including the transparent anode 1200, a second organic stack 130', and the cathode 140, for maintenance of transparency.

In association with the first and second organic light emitting elements OLED1 and OLED2, the cathode 140 is shared by the emission part E and the transmission part T/E without disconnection or spacing. On the other hand, the anodes of the first and second organic light emitting elements OLED1 and OLED2 are formed as the reflective anode 1100 and the transparent anode 1200 provided at the emission part E and the transmission part T/E in a divided manner, respectively. A transparent electrode material, which forms the transparent anode 1200, may also be included in the reflective anode 1100 of the emission part E as a transparent electrode layer 112 contacting a reflective electrode layer 111. In this case, the reflective electrode layer 112 may be a reflective electrode including any one of APC (Ag:Pb:Cu), Ag, and Al, and the transparent electrode layer 112 may include ITO, IZO, ITZO, or the like.

The cathode 140 may have a multilayer structure including a plurality of layers. Among the plural layers, the layer most adjacent to the first and second organic stacks 130 and 130' may include an inorganic compound. For example, the cathode 140 may include an inorganic compound layer doped with LiF or Li and, as such, it may be possible to reduce energy barrier when electrons are injected from the cathode 140 into the first and second organic stacks 130 and 130'. In this case, each of the layers in the cathode 140 may include metal.

The first and second organic stacks 130 and 130' may include the first and second light emitting layers EML1 and EML2, respectively. The first and second light emitting layers EML1 and EML2 may be formed in the same stack formation process.

In this case, the first and second light emitting layers EML1 and EML2 may be light emitting layers to emit light of the same color or light emitting layers to emit light of different colors. Although the first and second organic stacks 130 and 130' include the first and second light emitting layers EML1 and EML2 as single layers, respectively, the present invention is not limited thereto. For example, the first and second organic stacks 130 and 130' may further include common organic layers arranged beneath and over the first and second light emitting layers EML1 and EML2. In this case, the common organic layers are formed on the substrate 100 without using a deposition mask and, as such, may be provided at the emission part E and the transmission part T/E in common. If necessary, the first and second organic stacks 130 and 130' may further include, in addition to the common organic layers, a transport layer selectively provided at a predetermined sub-pixel in the emission part E or at the transmission part T/E, in order to adjust an optical position exhibiting an optimum efficiency of a corresponding color to be emitted in each of the emission part E and transmission part T/E. The transport layer, which is selectively provided at a predetermined sub-pixel in the emission part E or at the transmission part T/E, may be arranged to contact lower or upper surfaces of the first and second light emitting layers EML1 and EML2 and, as such, may adjust, between the reflective or transparent anode 1100 or 1200 and the cathode 140, an optimum position of an emission zone where emission of a corresponding color is carried out.

The first and second thin film transistors TFT1 and TFT2 are electrically connected to the reflective anode 1100 and the transparent anode 1200 via first and second connectors CT1 and CT2, respectively. The first and second connectors CT1 and CT2 are provided at the emission part E or the bank 150 and, as such, the transmission part T/E may exhibit an enhanced transmittance. In this case, the transparent anode 1200 may have a portion extending to the emission part E, to overlap with the second connector CT2. In this case, the transparent anode 1200 and the reflective anode 1100 are spaced apart from each other so that they are electrically isolated from each other.

Meanwhile, although not shown in the sectional view, the bank 150, which divides adjacent regions of the emission and transmission parts E and T/E, are made of a material such as polyimide, polyamide, or acryl, and have a thickness of 1 μm or more. Accordingly, the first and second organic stacks 130 and 130', which are thinly and planarly deposited in the emission part E and the transmission part T/E, respectively, may be divided from each other by the bank 150 in terms of region. In the first and second organic stacks 130 and 130', the remaining portions thereof, except for the light emitting layers EML1 and EML2 to emit different colors, that is, the common organic layers, may be formed without using a deposition mask. The thickness of the common organic layers at at least a side portion of the bank 150 is smaller than that of a planarized portion of the emission part E or transmission part T/E arranged inside the bank 150.

In addition to the first organic light emitting element OLED1 provided at the emission part E on the transparent substrate 100 and the second organic light emitting element OLED2 provided at the transmission part T/E on the transparent substrate 100, as described above, the display device of the present invention includes an opposite transparent substrate 200 facing the transparent substrate 100, a color filter layer 210 for selectively transmitting a color emitted from the light emitting layer EML1 in the emission part E in association with each sub-pixel, and an encapsulation layer 300 arranged between the transparent substrate having the first and second organic light emitting elements OLED1 and OLED2 and the opposite transparent substrate 200 having the color filter layer 210.

Meanwhile, the opposite transparent substrate 200 may be eliminated, if necessary. In this case, the color filter layer 210 may be arranged over the first organic light emitting element OLED1, and the encapsulation layer 300 may be formed to cover the first and second organic light emitting elements OLED1 and OLED2 and the color filter layer 210.

The transparent substrate 100 and the opposite transparent substrate 200 may be made of a transparent material allowing transmission of light, as in a glass substrate, a plastic substrate, or the like. The transparent substrate 100 and the opposite transparent substrate 200 may also be flexible for application of the display device to a flexible appliance. It is preferred that neither the transparent substrate 100 nor the opposite transparent substrate 200 be provided with a shading optical film such as a polarization plate, in order to enable the transmission part T/E to achieve both light emission and light transmission.

When such a polarization plate is eliminated from the display device, the color filter layer 210 in the emission part E may transmit light of a selected wavelength while absorbing light of wavelengths other than the selected wavelength and, as such, may also have an external light reflecting function.

Hereinafter, a planar layout and a detailed cross-section of each pixel in the display device of the present invention will be described with reference to the accompanying drawings.

Figure 3:
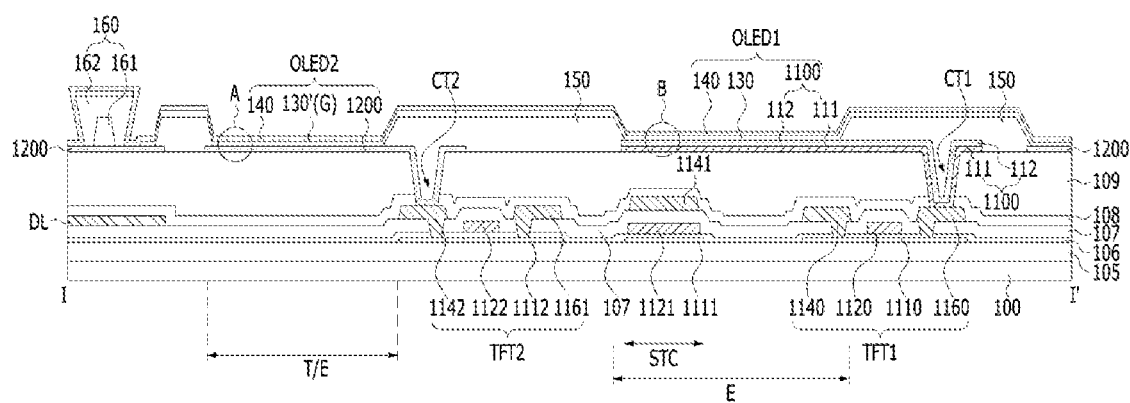
FIG. 3 is a cross-sectional view taken along line I-I' in FIG. 2.

FIG. 2 is a plan view illustrating a pixel configuration of the display device according to the present invention. FIG. 3 is a cross-sectional view taken along line I-I' in FIG. 2.

One transmission part T/E and emission parts E arranged around the transmission part T/E in a display device according to an embodiment of the present invention will be described hereinafter with reference to FIG. 2.

As illustrated in FIGS. 2 and 3, the display device according to the illustrated embodiment of the present invention includes emission parts E corresponding to respective overlapping portions of scan lines SL and data lines DL, and transmission parts T/E each arranged between adjacent ones of the emission parts E.

Each transmission part T/E should be transparent and, as such, is arranged not to overlap with the lines SL and DL and thin film transistors TFT1 and TFT2.

Banks 150 may be formed at regions other than the emission parts E and the transmission parts T/E, for example, to shield shading elements such as lines and to divide regions of neighboring pixels or sub-pixels.

Here, there may or may not be a region between adjacent ones of the emission parts E and the transmission parts T/E. When there is no region between adjacent ones of the emission parts E and the transmission parts T/E, each emission part E covers associated ones of the lines SL and DL and, as such, the lines arranged beneath the first organic light emitting element OLED1 in the emission part E is not visible.

The emission color arrangement in the display device according to the embodiment illustrated in FIGS. 2 and 3 will be described hereinafter.

In common, the transmission parts T/E are provided with green emission zones G(T/E) to form second organic light emitting elements OLED2, respectively. The emission parts E are arranged such that four emission parts E correspond to four corners of each transmission part T/E, respectively. Red emission zones RE and blue emission zones BE having multilayer structures of first organic light emitting elements OLED1 to emit colors different from the light emitting layer provided at each transmission part T/E are uniformly distributed in respective emission parts E around the transmission part T/E. The reason why the color emitted from the transmission part T/E is green G in the embodiment illustrated in FIG. 2 is that green exhibits the best visibility in driving at the same current, as compared to other colors. In this case, green light emitted from the second organic light emitting element OLED2 in each transmission part T/E corresponds to light of an intermediate wavelength between red light of the red emission zones RE and blue light of the blue emission zones BE. The color emitted from each transmission part T/E may be varied in accordance with the environment in which the display device is embodied or application-types of the display device.

Meanwhile, in the present invention, the wavelength of red is 600 to 650 nm, the wavelength of blue is 430 to 490 nm, and the wavelength of green is 510 to 590 nm and, as such, different colors are emitted.

A combination of two adjacent emission parts E respectively having a red emission zone RE and a blue emission zone BE and two transmission parts T/E arranged adjacent to the emission parts E may be referred to as a "pixel". Pixels having the above configuration are arranged on a transparent substrate 100 in plural rows and plural columns. In addition, first and second thin film transistors TFT1 and TFT2 are connected to each emission part E and each transmission part T/E, respectively, and, as such, each of the emission part E and the transmission part T/E functions as a sub-pixel.

In the embodiment illustrated in FIG. 2, red emission zones RE and blue emission zones BE are alternately arranged in vertical and horizontal directions, as emission parts E. In addition, a red organic light emitting layer is provided at each red emission zone RE, and a blue organic light emitting layer is provided at each blue emission zone BE.

Each of the red emission zones RE and the blue emission zones BE is surrounded by a plurality of transmission parts T/E spaced apart from one another when viewed in a plane. Each transmission part T/E includes a green light emitting layer G. Around each transmission part T/E, different color emission zones RE and BE may be arranged such that two color emission zones of one color are arranged at left upper and right lower positions in a first diagonal direction of the transmission part TE, and two color emission zones of the other color are arranged at right upper and left lower positions in a second diagonal direction of the transmission part TE. The emission parts E (RE and BE) may be arranged to correspond to intersections of the scan lines SL and the data lines DL, respectively. The transmission parts T/E may be arranged at positions not overlapping with the scan lines and the data lines DL while being spaced apart from associated ones of the emission parts E.

The first thin film transistor TFT1 of each emission part E (RE or BE) includes a first gate electrode 1120 formed at the same layer as a corresponding one of the scan lines SL, a first semiconductor layer 1110 overlapping, at a channel region thereof, with the first gate electrode 1120, and a first source electrode 1120 and a first drain electrode 1160, which are connected to the first semiconductor layer 1110 at opposite sides of the first semiconductor layer 1110, respectively. The first gate electrode 1120 may be formed as a protrusion pattern protruding from the corresponding scan line SL while being integrated with the corresponding scan line SL. The first source electrode 1140 may be formed as a protrusion pattern protruding from a corresponding one of the data lines DL. The first drain electrode 1160 is formed to be spaced apart from the first source electrode 1140. The first drain electrode 1160 is connected to a reflective anode 1100 of the first organic light emitting element OLED1 in the emission part E (RE or BE) via a first connector CT1.

The second thin film transistor TFT2 of each emission part E ((RE or BE) may be formed through the same process as the first thin film transistor TFT1. Accordingly, the second thin film transistor TFT2 includes a second gate electrode 1122 formed on the same layer as a corresponding one of the scan lines SL, a second semiconductor layer 1112 overlapping, at a channel region thereof, with the second gate electrode 1122, and a second source electrode 1161 and a second drain electrode 1142, which are connected to the second semiconductor layer 1112 at opposite sides of the second semiconductor layer 1112, respectively. The second gate electrode 1122 may be formed as a protrusion pattern protruding from the corresponding scan line SL while being integrated with the corresponding scan line SL.

Alternatively, a separate auxiliary scan line ASL (not shown) may be provided, and the second gate electrode 1122 may be formed as a protrusion pattern protruding from the auxiliary scan line ASL. When the second gate electrode 1122 is formed at or connected to the auxiliary scan line ASL, the second thin film transistor TFT2 may be driven at a time different from that of the first thin film transistor TFT1. The second source electrode 1161 may be formed as a protrusion pattern protruding from a corresponding one of the data lines DL. In this case, the data line DL, to which the second source electrode 1161 is connected, may differ from the data line DL, to which the first thin film transistor TFT1 arranged adjacent to the former data line DL is connected. The second drain electrode 1142 is formed to be spaced apart from a corresponding one of the data lines DL and the second source electrode 1161. The second drain electrode 1142 is connected to a transparent anode 1200 of the second organic light emitting element OLED2 in the emission part E (RE or BE) via a second connector CT2.

Hereinafter, the multilayer structure of the display device will be described in detail with reference to FIG. 3.

A buffer layer 105 is disposed on the transparent substrate 100. The first and second semiconductor layers 1110 and 1112 are disposed on the buffer layer 105, together with a third semiconductor layer 1111. The buffer layer 105 functions to prevent impurities remaining in the transparent substrate 100 from being introduced into the semiconductor layers 1110, 1112, and 1111. The semiconductor layers 1110, 1112, and 1111 may be amorphous or crystalline silicon semiconductor layers. Alternatively, the semiconductor layers 1110, 1112, and 1111 may be transparent oxide semiconductor layers. Opposite side portions of the first and second semiconductor layers 1110 and 1112, to which the first and second source electrodes 1140 and 1161 and the first and second drain electrodes 1160 and 1142 are connected, respectively, may be impurity-doped regions. The region defined between the impurity-doped regions in each of the first and second semiconductor layers 1110 and 1112 is an intrinsic region which may function as a channel region.

The third semiconductor layer 1111 may be disposed to overlap with storage electrodes 1121 and 1141 which will be formed above the third semiconductor layer 1111. When the third semiconductor layer 1111 is doped with impurities, the third semiconductor layer 1111 may function as an auxiliary storage electrode to increase the capacity of a storage capacitor associated therewith. If necessary, the third semiconductor layer 1111 may be eliminated.

A gate insulating film 106 is also provided to cover the first to third semiconductor layers 1110, 1112 and 1113. The first and second gate electrodes 1120 and 1122 and the storage electrode 1121, namely, a first storage electrode, are formed to overlap with the intrinsic regions of the first and second semiconductor layers 1110 and 1112 and the third semiconductor layer 1111.

A first interlayer insulating film 107 is provided to cover the first to third semiconductor layers 1110, 1112 and 1111, the first and second gate electrodes 1120 and 1122, and the first storage electrode 1121.

The first interlayer insulating film 107 and the gate insulating film 106 are selectively removed to form contact holes at opposite sides of the first semiconductor layer 1110 and opposite sides of the second semiconductor layer 1112, to form contact holes. The first source electrode 1140 and the first drain electrode 1160 are connected to the first semiconductor layer 1110 via corresponding ones of the contact holes. The second source electrode 1161 and the second drain electrode 1142 are connected to the second semiconductor layer 1112 via corresponding ones of the contact holes. The storage electrode 1141, namely, a second storage electrode, is formed on the first interlayer insulating film 107 overlapping with the first storage electrode 1121 in the same process as the source and drain electrodes.

In this case, the first thin film transistor TFT1 included in the emission part E (RE or BE) for driving of the first organic light emitting element OLED1 is constituted by the first semiconductor layer 1110, the first gate electrode 1120 overlapping, at the channel region thereof, with the first semiconductor layer 1110, and the first source electrode 1140 and the first drain electrode 1160 respectively connected to opposite sides of the first semiconductor layer 1110, which are arranged upwards from the bottom in this order. The second thin film transistor TFT2 included in the transmission part T/E for driving of the second organic light emitting element OLED2 is constituted by a multilayer structure identical to that of the first thin film transistor TFT1 without overlapping with the transmission part T/E. The multilayer structure of the second thin film transistor TFT2 includes the second conductor layer 1112, the second gate electrode 1122 overlapping, at the channel region thereof, with the second semiconductor layer 1112, and the second source electrode 1161 and the second drain electrode 1142 respectively connected to opposite sides of the second semiconductor layer 1112, which are arranged upwards from the bottom in this order.

In addition, a storage capacitor STC is formed by the first and second storage electrodes 1121 and 1141 overlapping with each other in a state in which the first interlayer insulating film 107 is interposed between the first and second storage electrodes 1121 and 1141.

A second interlayer insulating film 108 is formed to cover the first and second thin film transistors TFT1 and TFT2 and the storage capacitor STC.

In this case, the first and second thin film transistors TFT1 and TFT2 and the storage capacitor STC include shading metal layers and are arranged without overlapping with the transmission part T/E. Accordingly, the first and second thin film transistors TFT1 and TFT2 and the storage capacitor STC may be arranged in a state of overlapping with the emission part E (RE or BE) or a region where an associated one of the banks 150 is formed. In this case, the bank 150 may be disposed between the transmission part T/E and the emission part E or may be disposed between the red emission zone RE and the blue emission zone BE, which are included in respective emission parts E associated with the transmission part T/E while being spaced apart from each other. In the case of the emission part E, the reflective anode 1100 thereof prevents metal layers arranged therebeneath from being visible. In a region where the bank 150 is disposed, it may be possible to prevent configurations disposed beneath the region from being visible by thickly forming the bank 150.

Meanwhile, a planarizing film 109 is additionally formed to cover the first interlayer insulating film 108 while achieving surface planarization. The first and second connectors CT1 and CT2 are provided through selective removal of the planarizing film 109 and the second interlayer insulating film 108. Via the first and second connectors CT1 and CT2, the first and second thin film transistors TFT1 and TFT2 may be connected to the reflective anode 1100 and the transparent anode 1200, respectively.

Furthermore, the display device according to the illustrated embodiment of the present invention may further include barriers 160 formed at predetermined areas in regions where the transmission parts T/E and the emission parts E are not arranged, to divide adjacent ones of the transmission parts T/E or adjacent ones of the emission parts E. The barriers 160 function to prevent a deposition mask (not shown) used in depositing an organic material in formation of organic stacks 130 and 130'(G) from directly contacting the banks 150 dividing regions or zones and, as such, the banks 150 may maintain shapes thereof without collapsing.

Each barrier 160 may include a first layer 161 formed on the same layer as the banks 150, and a second layer 162 formed to cover the first layer 161 while having a predetermined height from an upper surface of the first layer 161. The second layer 162 may be formed on the same layer as spacers (not shown) formed on the banks 150, in order to prevent a deposition mask needed in formation of a common organic layer or a light emitting layer from directly contacting the banks 150 or sagging.

Hereinafter, various embodiments having various multilayer structures of the first and second organic light emitting elements OLED1 and OLED2 will be described. In each embodiment, each transmission part T/E has an electrode structure in which the transparent anode 1200 and the cathode 140 face each other, and each emission part E has an electrode structure in which the reflective anode 1100 and the cathode 140 face each other. Here, although the reflective anode 1100 is illustrated as having a double layer structure including a reflective electrode layer 111 and a transparent electrode layer 112, the present invention is not limited thereto. For example, the transparent electrode layer 112 may be eliminated, or a plurality of transparent electrode layers 112 and a plurality of reflective electrode layers 111 may be provided. When the reflective anode 1100 includes the transparent electrode layer 112, the transparent anode 1200 of the transmission part T/E may be formed in the same process as the transparent electrode layer 112. If necessary, in addition to the transparent electrode layer 112, which is formed over the reflective electrode layer 111, another transparent electrode layer may be formed beneath the reflective electrode layer 111. In this case, the transparent anode 1200 may have a double-layer transparent electrode structure.

Embodiments, which will be described hereinafter, have differences in terms of arrangement of the organic stacks 130 and 130'(G).

Meanwhile, in the display device of the present invention, each transmission part T/E thereof simultaneously performs light transmission and light emission and, as such, the anode configuration thereof and the configurations of the organic stack 130'(G) differ from those of each emission part E. In connection with this, various possible embodiments will be described hereinafter.

First Embodiment

Figure 4A:
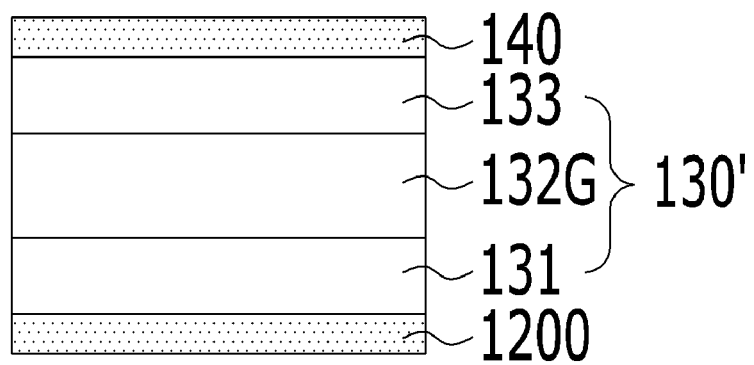
FIGS. 4A and 4B are cross-sectional views illustrating a display device according to a first embodiment of the present invention through regions A and B, respectively, in FIG. 3.
Figure 4B:
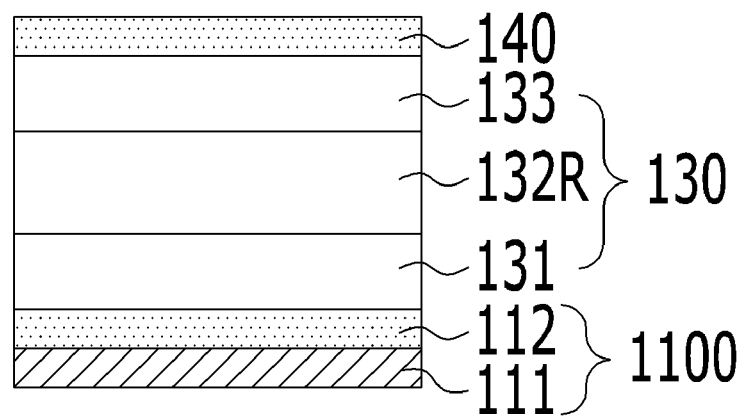

FIGS. 4A and 4B are cross-sectional views illustrating a display device according to a first embodiment of the present invention through regions A and B, respectively, in FIG. 3.

As illustrated in FIGS. 4A and 4B, the display device according to the first embodiment of the present invention has, as a first organic stack 130 in each emission part E thereof, a multilayer configuration including a first common organic layer 131, a first light emitting layer 132R, and a second common organic layer 133. The first common organic layer 131 may be provided with layers associated with hole transport. As these layers, a hole injection layer, a hole transport layer, an electron blocking layer, etc. may be provided. Meanwhile, the second common organic layer 133 may be provided with layers associated with electron transport. For example, the second common organic layer 133 may be provided with a hole blocking layer, an electron transport layer, and an auxiliary cathode layer.

The display device has, as a second organic stack 130' in each transmission part T/E thereof, a first common organic layer 131, a second light emitting layer 132G arranged to be separated from the first light emitting layer 132R, and a second common organic layer 133.

In the display device according to the first embodiment, the first and second organic stacks 130 and 130' in the emission part E and transmission part T/E, respectively, have the same configuration, except for the light emitting layers 132R and 132G. If necessary, in addition to the first and second common organic layers 131 and 133, a hole transport layer (not shown) may be further selectively provided in one or more of sub-pixels in the emission part E or in the transmission part T/E adjacent to the light emitting layers 132R and 132G in order to adjust the positions of the light emitting layers 132R and 132G exhibiting optimum emission efficiency in the organic stacks 130 and 130'. In this case, the green light emitting layer 132G of the transmission part T/E, the red light emitting layer 132R of the emission part E, and the blue light emitting layer of the emission part E may have different thicknesses.

Colors emitted from the light emitting layers provided at the emission part E and transmission part T/E are not limited to red and green. The emission part E or the transmission part T/E may further be provided with a light emitting layer to emit color different from the above-described colors. Alternatively, different light emitting layers may be provided at emission parts E having different zones or transmission parts T/E. However, when the green light emitting layer 132G exhibiting the best visibility is provided at each transmission part T/E, the display device may exhibit maximum emission efficiency, as compared to the case in which each transmission part T/E has a layer emitting a color different from that of the green light emitting layer 132G. Of course, the present invention is not limited to the above-described condition. When there is a color preferred in an application in which the display device is used, the light emitting layer provided at the transmission part T/E may be changed to a light emitting layer to emit a color different from green.

In the illustrated first embodiment, the second organic stack 130' between the transparent anode 1200 and the cathode 140 in each transmission part T/E has a single stack, and the first organic stack 130 between the reflective anode 1100 and the cathode 140 in each emission part E has a single stack.

Second Embodiment

Figure 5A:
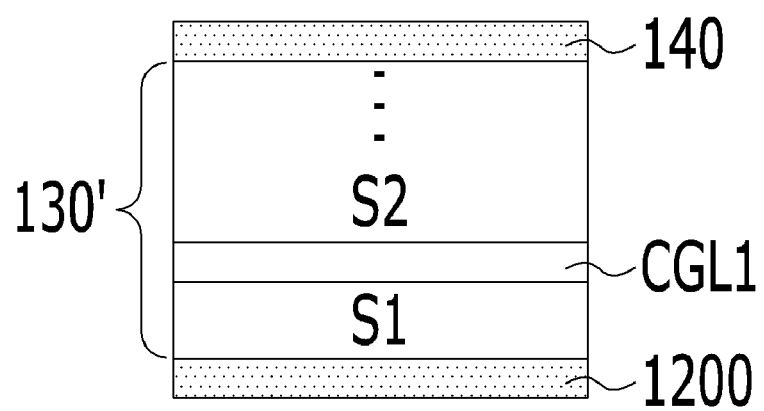
FIGS. 5A and 5B are cross-sectional views illustrating a display device according to a second embodiment of the present invention through regions A and B, respectively, in FIG. 3.
Figure 5B:
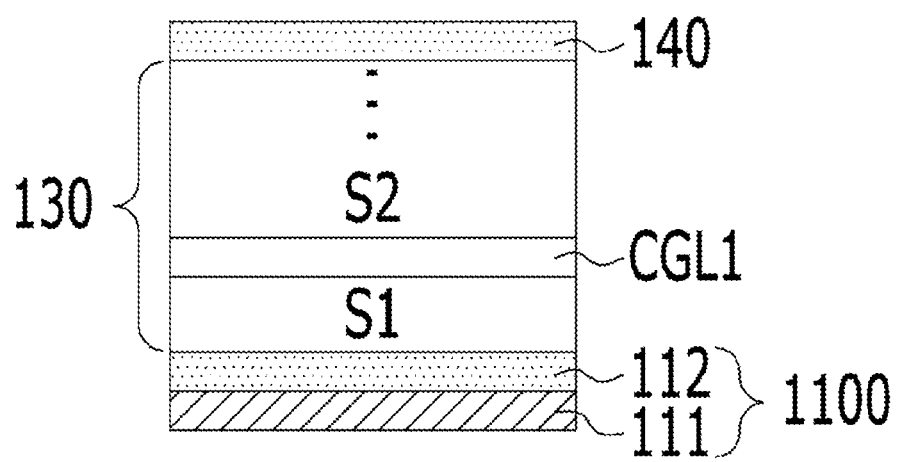

FIGS. 5A and 5B are cross-sectional views illustrating a display device according to a second embodiment of the present invention through regions A and B, respectively, in FIG. 3.

As illustrated in FIGS. 5A and 5B, in the display device according to the second embodiment of the present invention, each of the first and second organic stacks 130 and 130' thereof includes two or more sub-stacks S1, S2, . . . , adjacent ones of which are divided by a charge generation layer CGL.

In this case, each of the sub-stacks S1, S2, . . . may further include a light emitting layer 132R or 132B or a light emitting layer 132G, and first and second common layers CML1 and CML2 arranged over and beneath the light emitting layer, similarly to the first and second common organic layers 131 and 133 described in FIGS. 4A and 4B. In this case, each transmission part T/E and each emission part E may be divided by the light emitting layer 132R or 132B and the light emitting layer 132G, respectively. The first and second common layers CML1 and CML2 may be uniformly formed without having a difference in accordance with zones.

Third Embodiment

Figure 6A:
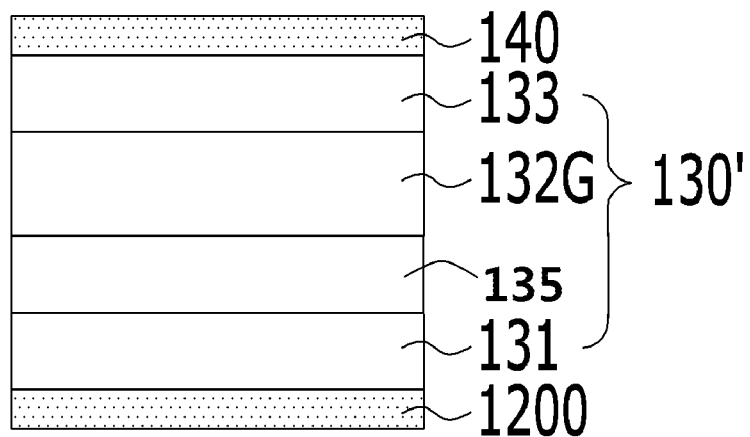
FIGS. 6A and 6B are cross-sectional views illustrating a display device according to a third embodiment of the present invention through regions A and B, respectively, in FIG. 3.
Figure 6B:
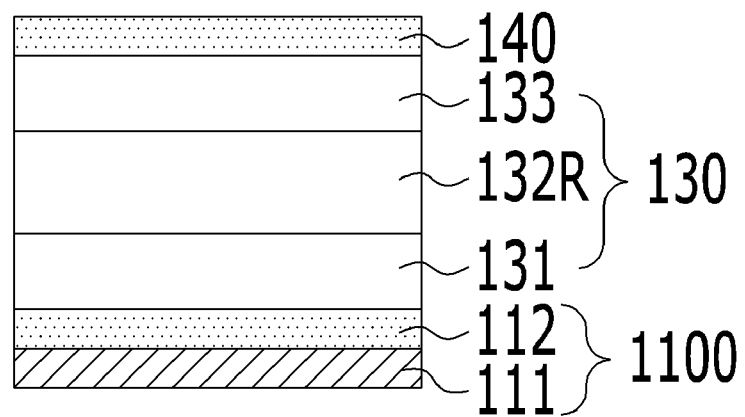

FIGS. 6A and 6B are cross-sectional views illustrating a display device according to a third embodiment of the present invention through regions A and B, respectively, in FIG. 3.

As illustrated in FIGS. 6A and 6B, the display device according to the third embodiment of the present invention includes emission parts E having the same configuration as the emission parts E of FIG. 4A. In this display device, however, each transmission part T/E thereof further selectively includes an optical compensation layer (OCL) 135 arranged adjacent to the second light emitting layer 132G of the transmission part T/E. The reason why the optical compensation layer 135 is provided is that the second organic light emitting element OLED2 of the transmission part T/E includes the transparent electrode 1200 as a lower electrode thereof, differently from the reflective anode 1100 in each emission part E and, as such, the Fabry-Peort effect generated in the second organic light emitting element OLED 2, which causes a reflection interference phenomenon, differs from the Fabry-Perot effect generated between the reflection anode 1100 and the cathode 140 in the first organic light emitting element OLED1. That is, the reflection interference phenomenon generated in the second organic light emitting element OLED2 of each transmission part T/E in accordance with an arrangement having the transparent anode 1100, which is transparent, and the cathode 1400 facing the transparent anode 1100 while having transmissivity or reflectivity/transmissivity is exhibited to be different from that of the first organic light emitting element OLED1. To this end, the transmission part T/E further includes the optical compensation layer 135 in order to adjust the vertical position of the second light emitting layer 132G and, as such, to enable the transmission part T/E to achieve optimum light emission through the cathode 140 when the transmission part T/E is used for light emission. In this case, the optical compensation layer 135 is arranged to contact the second light emitting layer 132G. Furthermore, when the optical compensation layer 135 is disposed beneath the second light emitting layer 132G, there is an advantage in adjusting the position of the second light emitting layer 132G between the transparent anode 1100 and the cathode 140. Meanwhile, when the optical compensation layer 135 has a thickness of about 400 Å to 1,200 Å, the optical compensation layer 135 is effective for optimum emission efficiency of the transmission part T/E. Accordingly, the second organic stack 130' is thicker than the first organic stack 130 in that the transmission part T/E further includes the optical compensation layer 135, as compared to the emission part E.

Fourth Embodiment

Figure 7A:
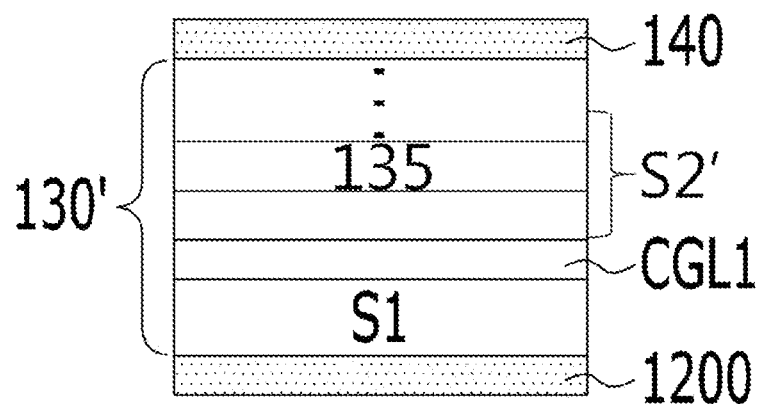
FIGS. 7A and 7B are cross-sectional views illustrating a display device according to a fourth embodiment of the present invention through regions A and B in FIG. 3.
Figure 7B:
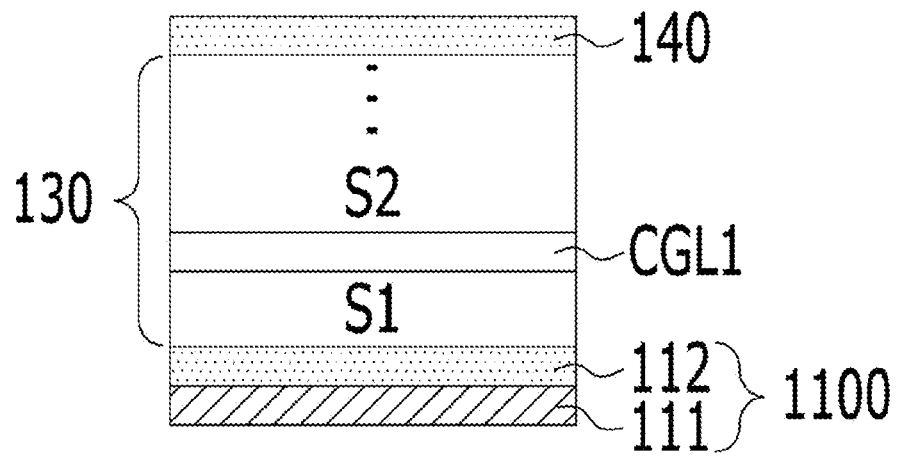

FIGS. 7A and 7B are cross-sectional views illustrating a display device according to a fourth embodiment of the present invention through regions A and B, respectively, in FIG. 3.

As illustrated in FIGS. 7A and 7B, in the display device according to the fourth embodiment of the present invention, each of the first and second organic stacks 130 and 130' thereof includes two or more stacks S1, S2, . . . , as in the display device according to the second embodiment illustrated in FIGS. 5A and 5B. However, the second organic stack 130' further includes an optical compensation layer 135 provided at at least one of the stacks S1, S2, . . . , to contact a light emitting layer 132G of the stack. The optical compensation layer 135 may be provided at each of all the light emitting layers included in the first and second organic stacks 130 and 130'. Alternatively, the optical compensation layer 135 may be provided at one of the stacks S1, S2, . . . , to contact the light emitting layer of the sub-stack. Alternatively, when there are three or more sub-stacks, optical compensation layers 135 may be provided to contact light emitting layers in two or more of the stacks, respectively. In any of the above cases, the total thickness of the optical compensation layers 135 in the entirety of the organic stacks is preferably 400 Å to 1,200 Å.

In this case, the optical compensation layers 135 may be formed using the same material as that of any one of the organic layers included in the first and second organic stacks. Alternatively, the optical compensation layers 135 may include a material different from that of any one of the organic layers included in the first and second organic stacks. If necessary, the optical compensation layers 135 may be formed using an inorganic material, so long as the inorganic material does not reduce light extraction in the transmission part T/E and the emission part E.

If necessary, the optical compensation layer 135 may be arranged not only beneath the light emitting layer EML, but also over the light emitting layer EML, when each of the organic stacks 130 and 130' is constituted by a plurality of sub-stacks. When optical compensation layers are arranged at several of plural sub-stacks, arrangement of the optical compensation layers is set in such a manner that one optical compensation layer may be arranged beneath one sub-stack, and another optical compensation layer may be arranged over another sub-stack, and, as such, it may be possible to adjust positions of light emitting layers EML1, EML2, . . . of the sub-stacks between the transparent anode 1200 and the cathode 140.

Hereinafter, various forms of the fourth embodiment will be described with reference to the accompanying drawings.

Figure 8:
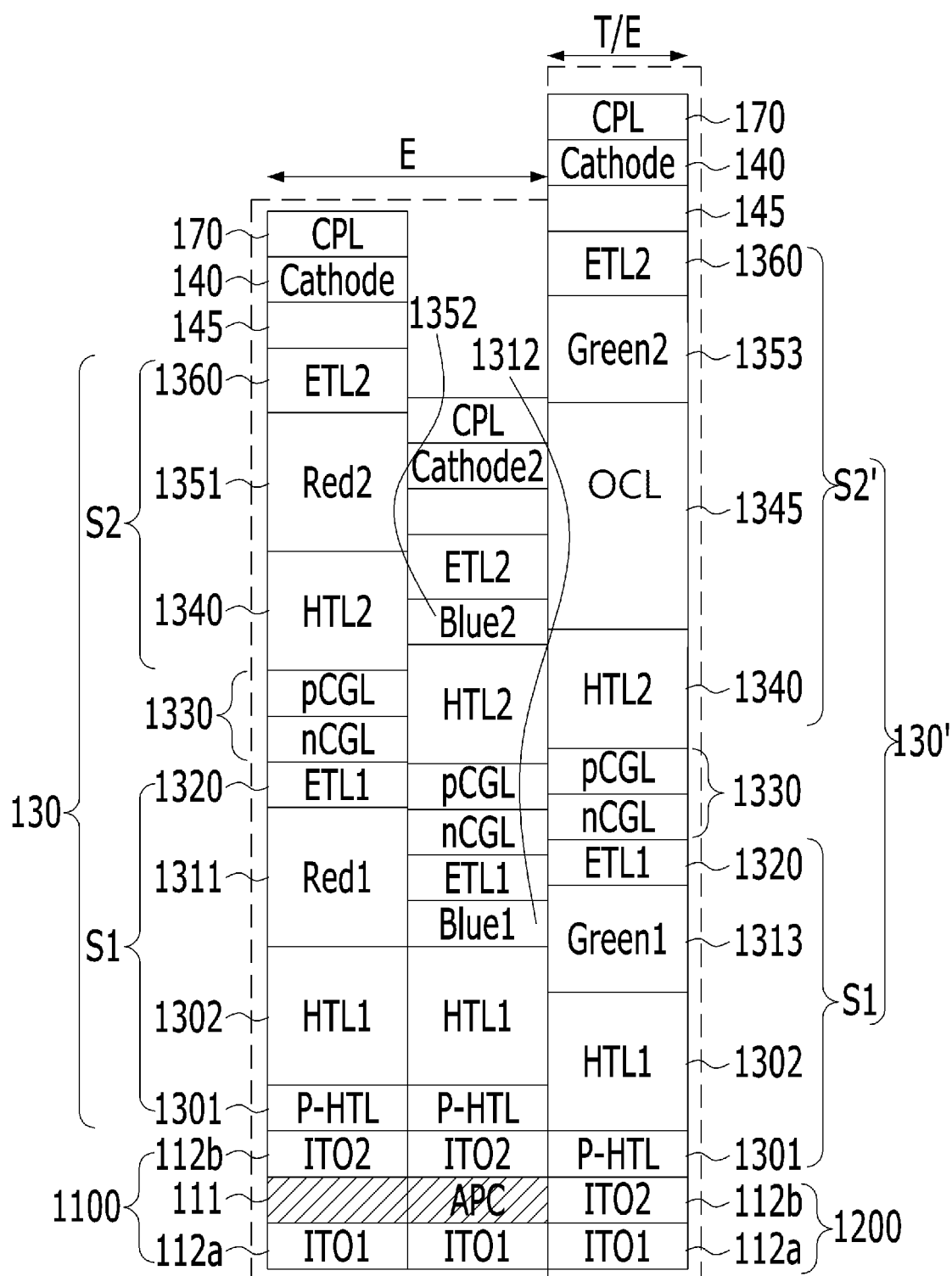
FIGS. 8 to 10 are cross-sectional views illustrating various forms of the fourth embodiment of the present invention, respectively.
Figure 9:
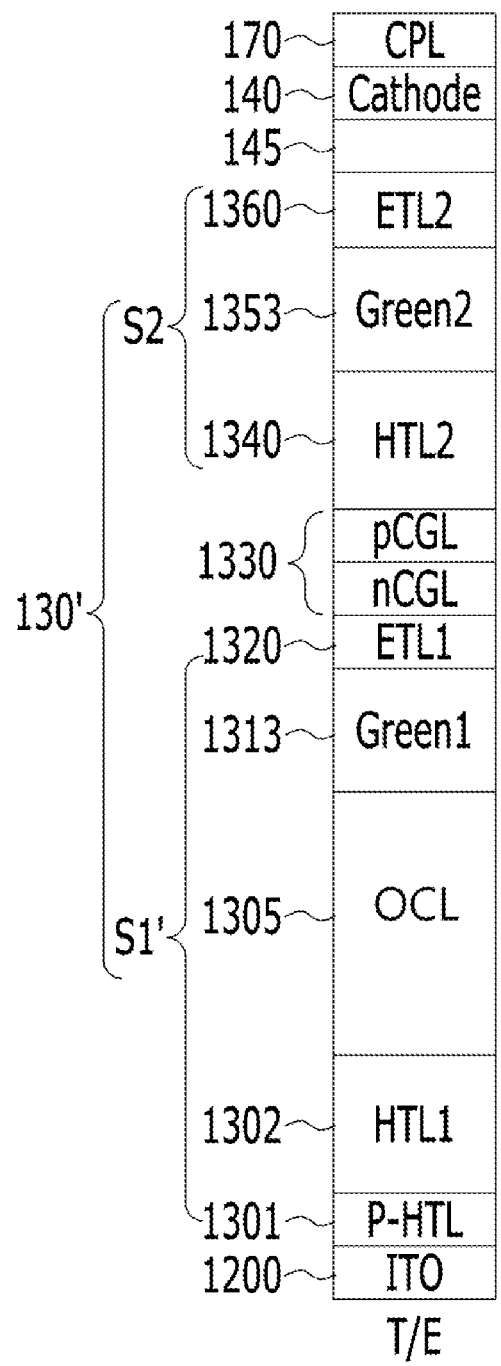
Figure 10:
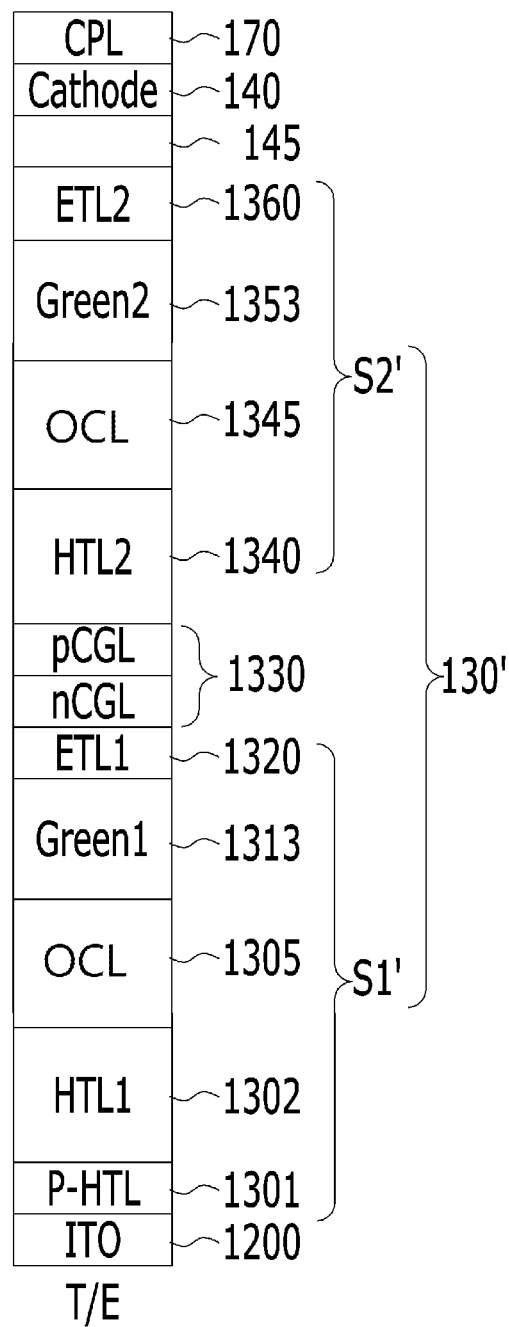

FIGS. 8 to 10 are cross-sectional views illustrating various forms of the fourth embodiment of the present invention, respectively.

FIG. 8 illustrates a first organic light emitting element OLED1 of an emission part E and a second organic light emitting element OLED2 of a transmission part T/E in a display device according to a first form of the fourth embodiment of the present invention.

As illustrated in FIG. 8, the first organic light emitting element OLED1 in the display device according to the first form of the fourth embodiment of the present invention includes two sub-stacks S1 and S2 provided between a reflective anode 1100 and a cathode 140.

The first sub-stack S1 includes a p-type hole transport layer 1301, a first hole transport layer 1302, a first sub-stack-associated light emitting layer 1311(Red1)/1312 (BLue1), and a first electron transport layer 1320, which are arranged in this order.

A charge generation layer 1330 is formed on the first sub-stack S1. The charge generation layer 1330 has a layered structure including an n-type charge generation layer nCGL and a p-type charge generation layer pCGL. If necessary, the charge generation layer 1330 has a single layer structure including a host doped with a p-type dopant and an n-type dopant. Alternatively, the charge generation layer 1330 may further include a buffer layer (not shown) provided between the p-type charge generation layer pCGL and the n-type charge generation layer nCGL and, as such, may have a triple layer structure.

The second sub-stack S2 is arranged on the charge generation layer 1330. The second sub-stack S2 has a multilayer structure including a second hole transport layer 130, a second sub-stack-associated light emitting layer 1351 (Red2)/1352(Blue2), and a second electron transport layer 1360.

Before formation of the cathode 140, an auxiliary cathode layer 145 may be formed on the second sub-stack S2. The auxiliary cathode layer 145 may be made of an inorganic compound such as LiF and a transmissive or semi-transmissive metal compound having a low work function.

A capping layer 170 made of an organic material may be further formed on the auxiliary cathode layer 145, to protect the cathode 140 while enhancing top light extraction. The auxiliary cathode layer 145 may be included in the cathode 140, as a constituent element of the cathode 140, in that the auxiliary cathode layer 145 contains metal and is made of an inorganic material or an inorganic compound.

The capping layer 170 may be formed, using the same material as one layer of the first and second organic stacks, in a final step in a process of forming the first and second organic light emitting elements OLED1 and OLED2 before assembly of the transparent substrate 100 to the opposite transparent substrate 200 (FIG. 1). In this regard, the capping layer 170 may be included in configurations of the first and second organic light emitting elements OLED1 and OLED2 in the transmission part T/E and emission part E.

In this case, the light emitting layers Red1 and Red2/Blue1 and Blue2 respectively provided at the first and second sub-stacks S1 and S2 emit the same color and, as such, a pure color is emitted from each sub-pixel.

In the first form of the fourth embodiment of the present invention illustrated in FIG. 8, the emission part E and the transmission part T/E have the same first sub-stacks S1 and the same charge generation layers 1330, respectively, but differ from each other in that, in association with the transmission part T/E, the second sub-stack S2 arranged on the charge generation layer 1330 further includes an optical compensation layer 1345 provided between a second hole transport layer 1340 and a second sub-stack-associated light emitting layer Green2.

In this case, similarly to the emission part E, the transmission part T/E includes first and second sub-stack-associated light emitting layers Green1 and Green 2 emitting the same color, which are provided at the first and second sub-stacks S1 and S2', respectively.

Each red light emitting layer Red1 or Red2, each blue light emitting layer Blue1 or Blue2, and each green light emitting layer Green 1 or Green 2, which emit different colors, may have different thicknesses. In this case, the light emitting layer emitting light of a longer wavelength may have a greater thickness. Even the same light emitting layers of the first subs-stack S1 and the second sub-stacks S2 and S2' may have different thicknesses or different light emission dopant concentrations, if necessary.

In any of the above-described cases, the first form of the fourth embodiment of the present invention has a feature in that the optical compensation layer 1345 is additionally provided only in the transmission part T/E and, as such, the second sub-stacks S2 and S2' differ from each other. The reason why the optical compensation layer 1345 is additionally provided is that the emission part E and the transmission part T/E differ from each other in terms of the anode electrodes 1100 and 1200.

When the configuration of the first organic stack 130 determined to set positions of the light emitting layers Red1 and Red2/Blue1 and Blue2 of the first and second sub-stacks S1 and S2 between the reflective anode 1100 and the cathode 140 in the emission part E such that the set positions are suitable for top light extraction is applied to the second organic stack 130' without modification, a degradation in light extraction efficiency may occur. In connection with this, the inventors found that, when the distance between the transparent anode 1200 and the cathode 140 in the transmission part T/E, that is, the length of the second organic stack 130', is longer than the distance between the reflective anode 1100 and the cathode 140 in the emission part E, the light extraction efficiency of the transmission part T/E is enhanced. In particular, the first form of the fourth embodiment illustrated in FIG. 8 shows the case in which the transmission part T/E further includes the optical compensation layer 1345 arranged beneath the second sub-stack-associated light emitting layer Green2 designated by reference numeral "1353" while contacting the second sub-stack-associated light emitting layer Green2 in the second stack S2'.

Meanwhile, the reflective anode 1100 may have a layered structure including a reflective electrode layer 111, a first transparent electrode layer 112a arranged beneath the reflective electrode layer 111, and a second transparent electrode layer 112b arranged over the reflective electrode layer 111. In this case, the transparent anode 1200 may have a layered structure including first and second transparent electrodes 112a and 112b layered to contact each other. In this case, the reflective anode 1100 and the transparent anode 1200 may be formed in the same process.

In accordance with a second form of the fourth embodiment of the present invention illustrated in FIG. 9, an optical compensation layer 1305 is arranged beneath the first sub-stack light emitting layer Green1 of the first sub-stack S1' while contacting the first sub-stack light emitting layer Green1 in the transmission part T/E. The second form of the fourth embodiment may be identical to the first form of the fourth embodiment illustrated in FIG. 8 in terms of the emission parts E, except that the transmission parts T/E thereof differ from each other.

In accordance with a third form of the fourth embodiment of the present invention illustrated in FIG. 10, optical compensation layers 1305 and 1345 are provided at the first and second sub-stacks S1' and S2' in the transmission part T/E, respectively. The third form of the fourth embodiment may be identical to the first form of the fourth embodiment illustrated in FIG. 8 in terms of the emission parts E, except that the positions and thicknesses of the optical compensation layers 1305 and 1345 in the transmission part E of the third form differ from those of the transmission part E in the first form.

The thickness of the optical compensation layer 1305 or 1345 provided at the transmission part T/E of FIG. 8 or 9 may be 400 Å to 1,200 Å. The total thickness of the optical compensation layers 1305 and 1345 in the transmission part T/E of FIG. 10 may be 400 Å to 1,200 Å. In the case in which both the stacks S1' and S2' have optical compensation layers, for example, the optical compensation layers 1305 and 1345, respectively, the thickness of each optical compensation layer 1305 or 1345 may be smaller than that of the case in which only one of the stacks S1' and S2' has an optical compensation layer.

The above-described forms of the fourth embodiment are associated with an example in which two stacks are provided between an anode and a cathode. Examples including three or more stacks may also have the same features as those of the above-described forms of the fourth embodiment in that the same light emitting layers are applied to respective stacks, and an optical compensation layer is further provided at at least one stack in the transmission part.

Figure 11:
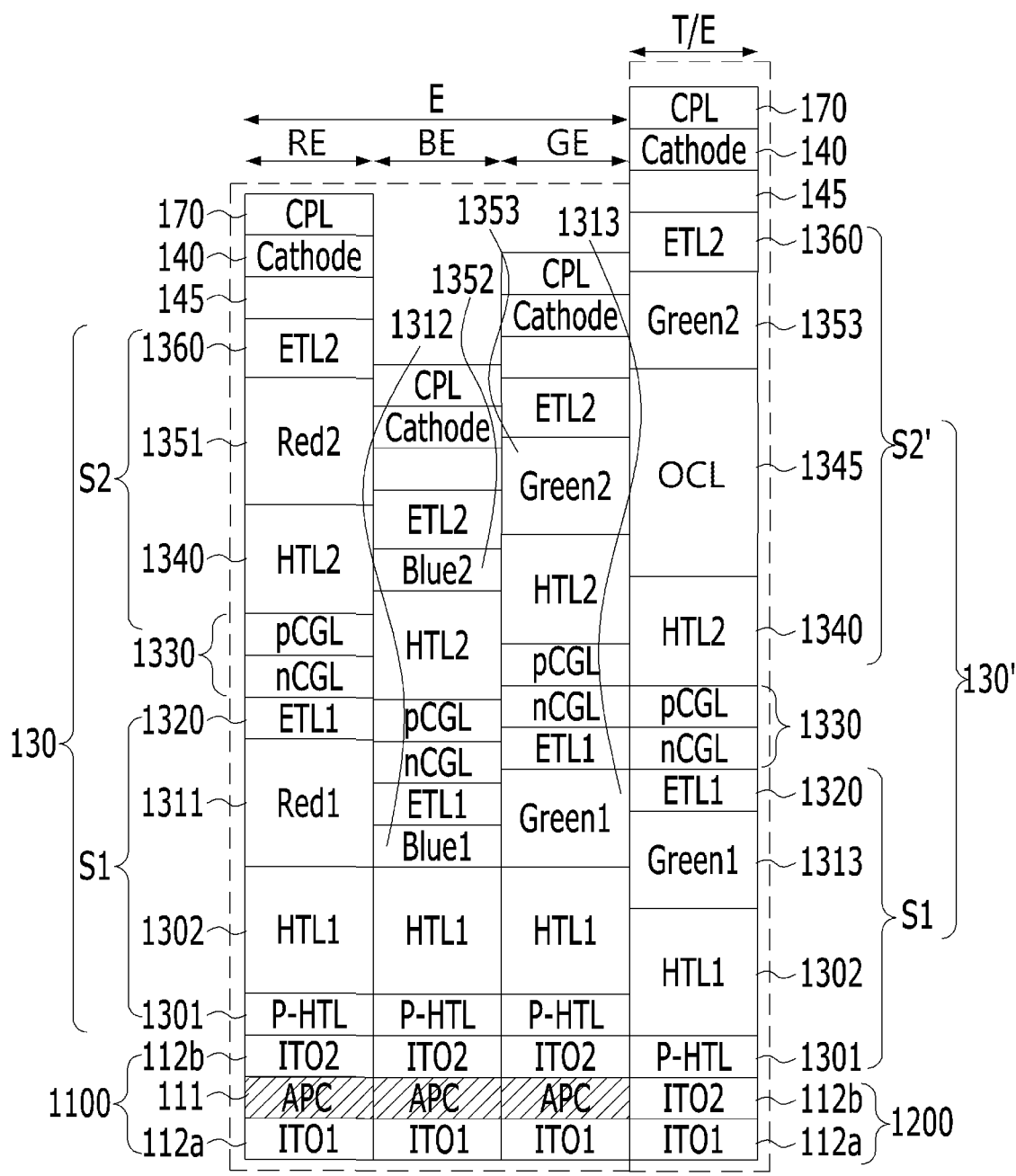
FIG. 11 is a cross-sectional view illustrating a display device according to a fifth embodiment of the present invention.

FIG. 11 is a cross-sectional view illustrating a display device according to a fifth embodiment of the present invention.

As illustrated in FIG. 11, the display device according to the fifth embodiment of the present invention has a feature in that the emission part E, which includes a red emission zone RE including red light emitting layers 1131 (Red1) and 1351 (Red2) respectively provided through stack structures such as the sub-stacks S1 and S2, and a blue light emitting zone BE including blue light emitting layers 1312 (Blue1) and 1352 (Blue2) provided through the stack structures, respectively, further includes a green emission part GE having green light emitting layers 1313 (Green 1) and 1353 (Green 2) provided through the stack structures, respectively, to emit the same color as the light emitting layers 1313 (Green 1) and 1353 (Green 2) provided through stack structures at the transmission part T/E in order to achieve an enhancement in the visibility in emission display, as compared to the first form of the fourth embodiment. The layered structure of the light emitting layers in the emission part E is identical to that of the light emitting layers described in conjunction with FIGS. 8 to 10, except for colors emitted from the light emitting layers and, as such, no detailed description will be given of the same layered structure.

The structure of the fifth embodiment is formed by forming a second organic stack 130' on a transparent anode 1200 in such a manner that: a first stack S1 including a p-type hole transport layer 1301, a first hole transport layer 1302, a first green light emitting layer 1313, and a first electron transport layer 1320 is formed on the transparent anode 1200; a charge generation layer 1330 having a layered structure including an n-type charge generation layer nCGL and a p-type charge generation layer pCGL is formed on the first stack S1; and a second stack S2' including a second hole transport layer 1340, an optical compensation layer 1345, a second green light emitting layer 1353, and a second electron transport layer 1360 is then formed on the charge generation layer 1330.

Hereinafter, the fact that the combination of emission and transmission parts E and T/E in the display device according to the present invention is more effective than that of a front emission display device or a transparent display device will be described through experiments.

Respective efficiencies and respective color coordinate characteristics of the emission and transmission parts in the display device of the present invention will be described through experiments. Table 1 (FIGS. 12A and 12B) and Table 2 (FIGS. 13A and 13B) differ from each other in terms of the material of the cathode in that one cathode is made of an alloy of Ag:Mg, and the other cathode is made of indium zinc oxide (IZO). The configuration in each experimental example corresponds to that of FIG. 11. The display device of the present invention used in the experiments is manufactured in accordance with the following manufacturing method.

Figure 12A:
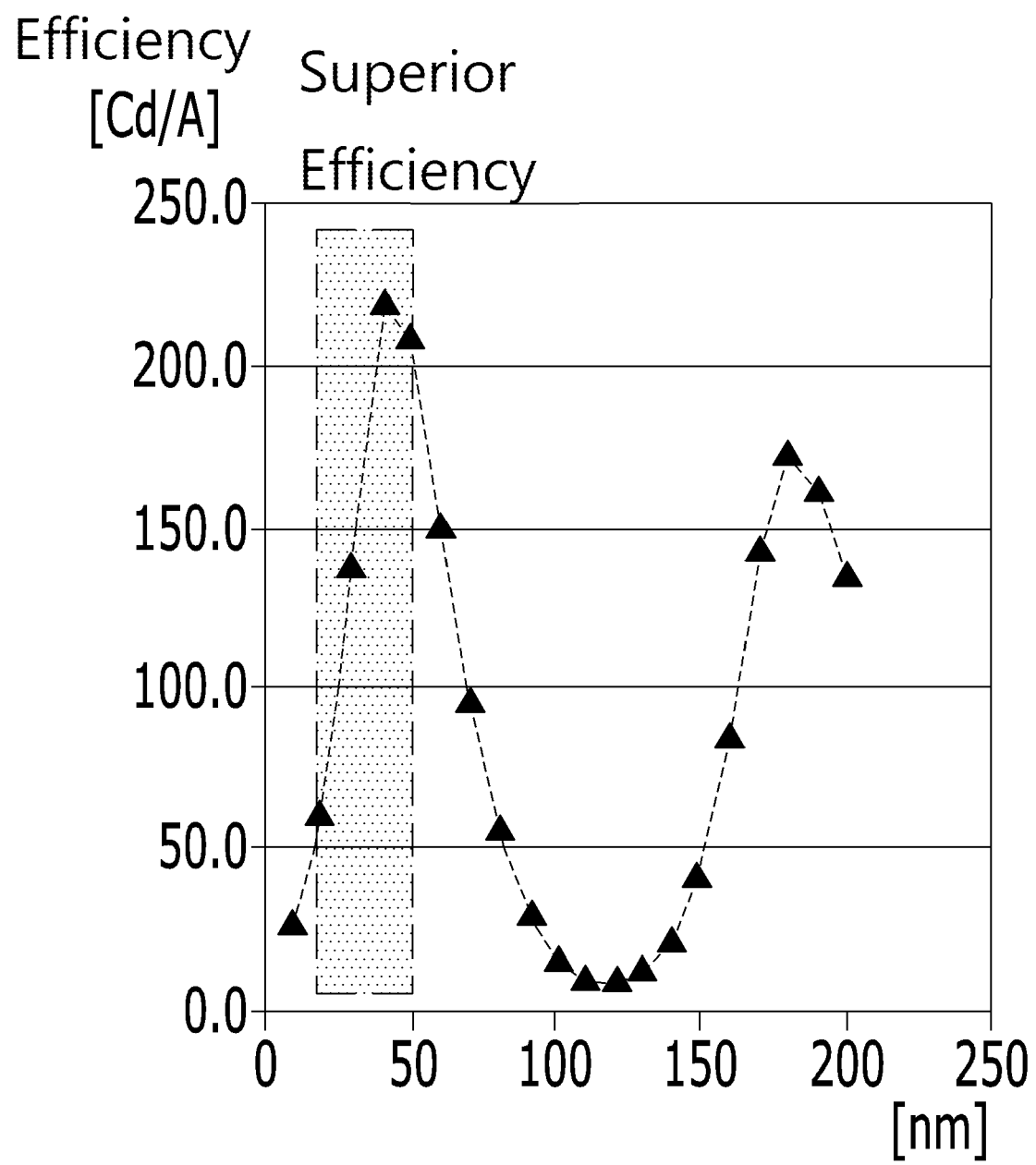
FIGS. 12A and 12B are graphs depicting the efficiency and CIE (color coordinate) characteristics of a display device according to a first form of the fifth embodiment of the present invention, respectively.
Figure 12B:
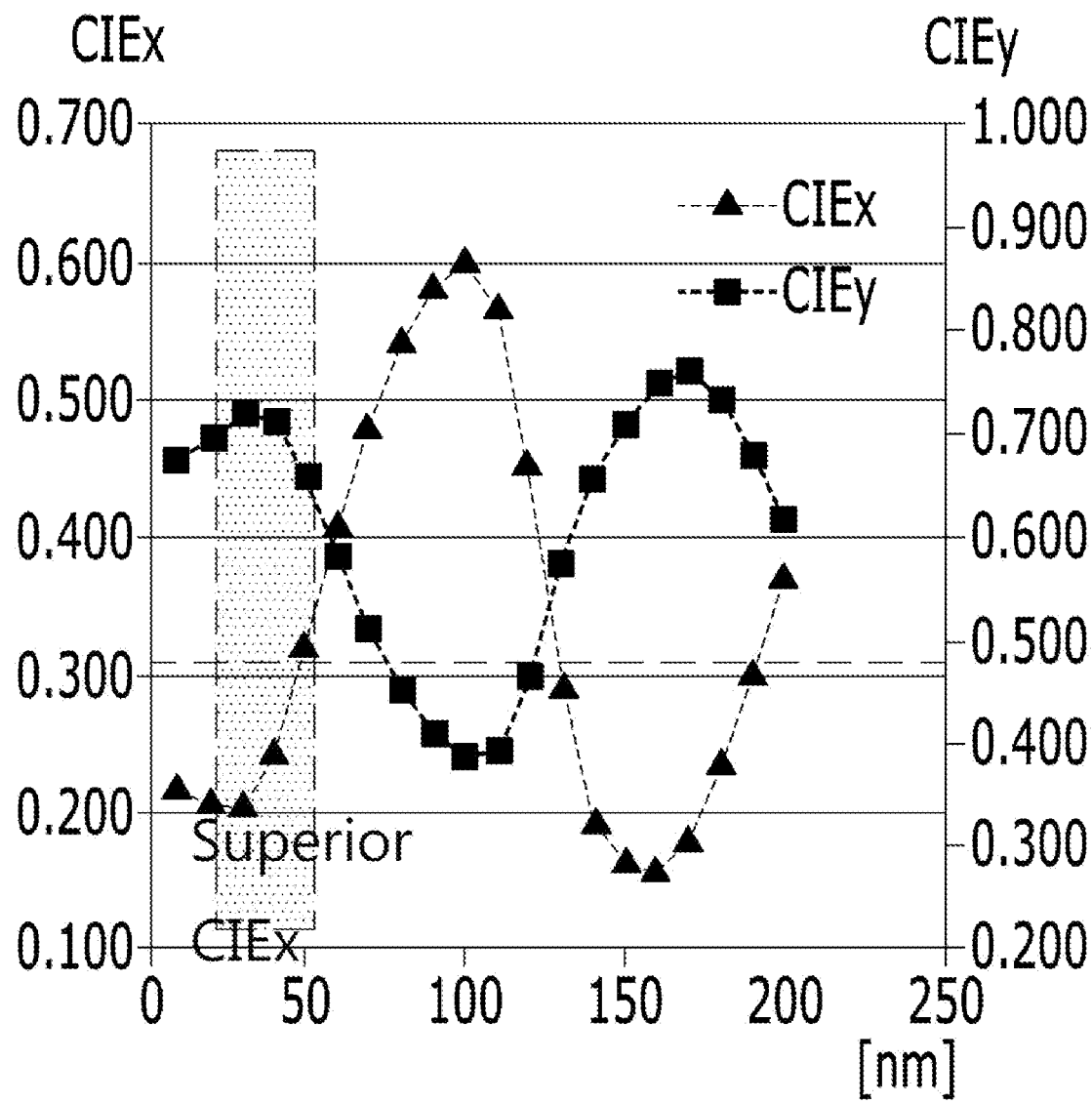
Figure 13A:
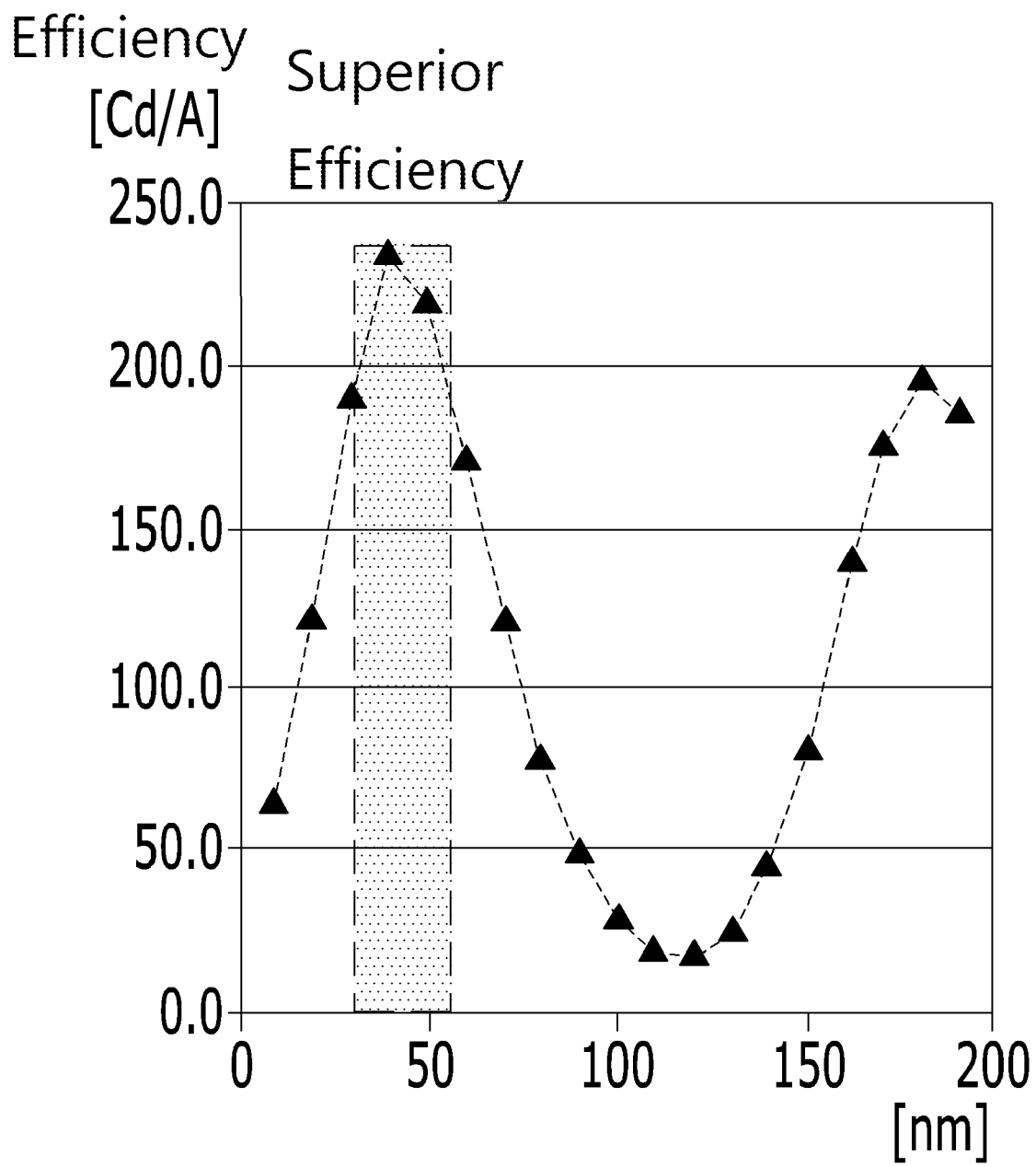
FIGS. 13A and 13B are graphs depicting the efficiency and CIE characteristics in an emission part of a display device according to a second form of the fifth embodiment of the present invention, respectively.
Figure 13B:
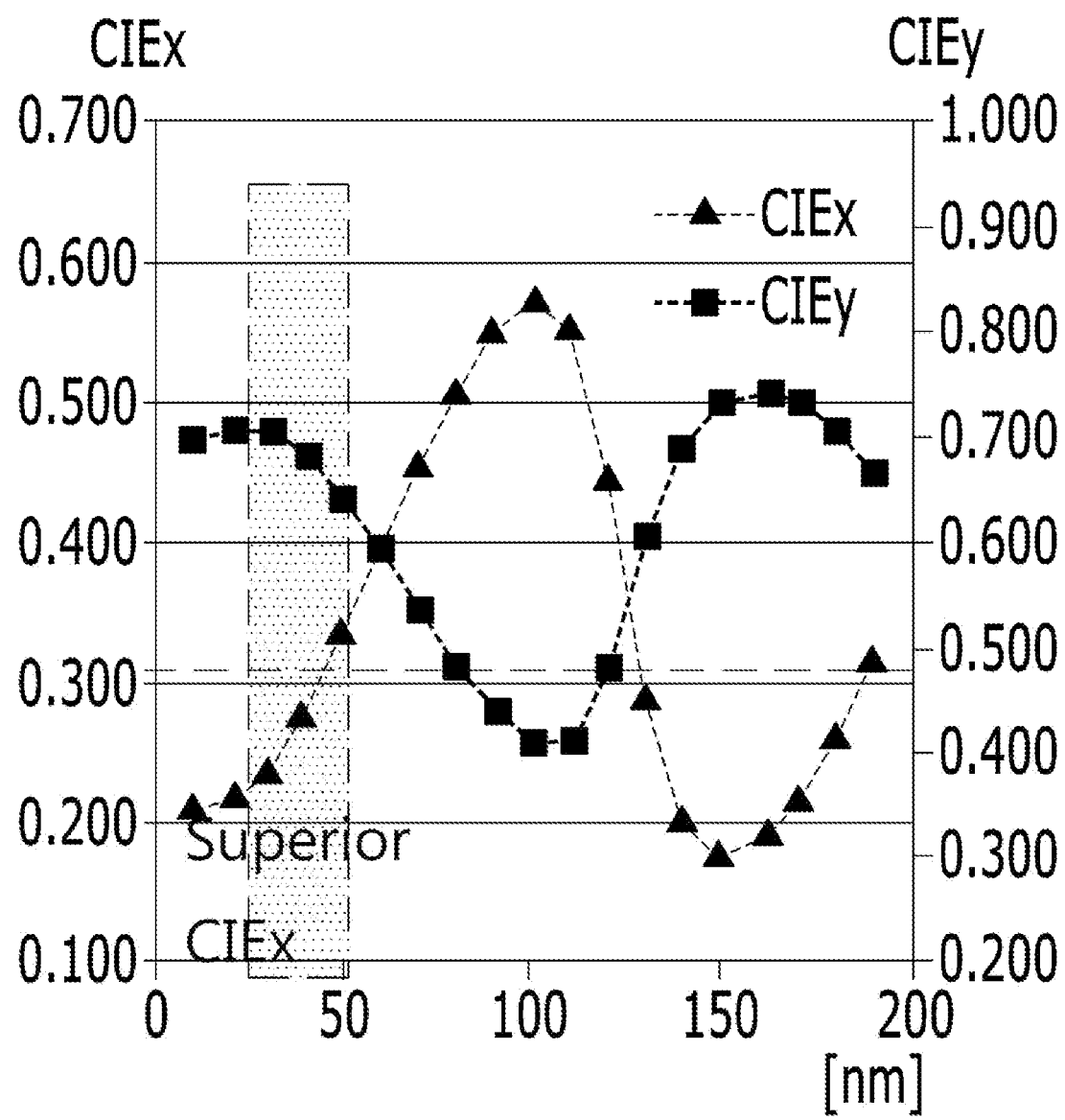

FIGS. 12A and 12B are graphs depicting the efficiency and CIE characteristics of the display device according to the first form of the fifth embodiment of the present invention, respectively. FIGS. 13A and 13B are graphs depicting the efficiency and CIE characteristics in the emission part of the display device according to the second form of the fifth embodiment of the present invention, respectively.

Each of the organic light emitting elements in the emission parts of the display device according to the present invention is constituted by the reflective anode 1100, the cathode 140, which is of a reflective type or a reflective/transmissive type, and the first organic stack disposed between the reflective anode 1100 and the cathode 140. In accordance with emitted colors, the emission parts are divided into first to third emission parts RE, BE, and GE.

The first organic stack S1 includes a first sub-stack S1 including first sub-stack-associated light emitting layers 1311, 1312 and 1313, a charge generation layer 13300 (CGL), and a second sub-stack S2 including second sub-stack-associated light emitting layers 1351, 1352 and 1353 layered on the charge generation layer 1330.

In addition to the first sub-stack-associated light emitting layers 1311, 1312 and 1313, the first sub-stack S1 includes a p-type hole transport layer 1301, a first hole transport layer 1302, and a first electron transport layer 1310. The p-type hole transport layer 1301 is formed to have a thickness of 50 Å. The first hole transport layer 1302 is made of NPD, and is formed to have a thickness of 400 Å. The first electron transport layer 1320 is made of an anthracene-based organic compound, and is formed to have a thickness of 150 Å. The first sub-stack-associated light emitting layers 1311, 1312 and 1313 may have different thicknesses. The green light emitting layer 1313 is formed to have a thickness of 400 Å, the red light emitting layer 1311 is formed to have a thickness of 600 Å to 700 Å, and the blue light emitting layer 1312 is formed to have a thickness of 150 Å to 250 Å.

The charge generation layer 1330 has a layered structure including an n-type charge generation layer nCGL and a p-type charge generation layer pCGL. The n-type charge generation layer nCGL and the p-type charge generation layer pCGL are formed to have thicknesses of 150 Å and 60 Å, respectively.

The second sub-stack S2 includes a second hole transport layer 1340, second sub-stack-associated light emitting layers 1351, 1352 and 1353, and a second electron transport layer 1360. The second hole transport layer 1340 is made of NPD, and is formed to have a thickness of 400 Å. The second electron transport layer 1360 is made of an anthracene-based compound and a LiQ-based compound, and is formed to have a thickness of 300 Å. The second sub-stack-associated light emitting layers 1351, 1352 and 1353 may have different thicknesses. The green light emitting layer 1353 is formed to have a thickness of 400 Å, the red light emitting layer 1351 is formed to have a thickness of 600 Å to 700 Å, and the blue light emitting layer 1352 is formed to have a thickness of 150 Å to 250 Å.

The reflective anode 1100 has a layered structure including a first transparent electrode layer 112a, a reflective electrode 111, and a second transparent electrode layer 112b. In this case, the first and second transparent electrode layers 112a and 112b are made of indium tin oxide (ITO), and the reflective electrode 111 is made of an APC(Ag:Pb:Cu) alloy. The first and second transparent electrode layers 112a and 112b are formed to have a thickness of 70 Å, and the reflective electrode 111 is formed to have a thickness of 1,000 Å.

In the experimental example of FIGS. 12A and 12B and Table 1, an auxiliary cathode layer 145, which is arranged on the first organic stack 130, is made of a material having a composition of Mg:LiF corresponding to 1:1, and is formed to have a thickness of 30 Å. Thereafter, the cathode 140 is formed using a material having a composition of Ag:Mg corresponding to 3:1, to have a thickness of 160 Å.

A capping layer 170 is then formed by depositing an NPD material to a thickness of 650 Å.

The experimental example of FIGS. 13A and 13B and Table 2 differs from the above-described experiment in that the cathode 140 is made of IZO, and is formed to have a thickness of 300 Å.

Experiments were carried out under the condition that the cathodes 140 in the experimental examples of Tables 1 and 2 use an AgMg alloy and IZO, respectively, and the remaining configurations thereof are the same, to evaluate efficiencies and color coordinates of the green emission parts in the experimental examples. That is, the experiments were carried out under the condition that, in the two experimental examples, the configurations of the first and second organic stacks S1 and S2 are the same, and there is a difference only between the materials of the cathodes 140. In the two experiments, a variation in efficiency and a variation in color coordinate characteristics were observed under the condition that each second hole transport layer HTL2 in the second sub-stack S2 is varied in thickness, in order to find an appropriate position of an associated one of the light emitting layers.

TABLE 1

Reflective Anode (APC)/Cathode (AgMg)

| HTL2 (Å) | Efficiency (Cd/A) | CIEx | CIEy |
|---|---|---|---|
| 100 | 27.6 | 0.219 | 0.672 |
| 200 | 62.6 | 0.208 | 0.694 |
| 300 | 139.0 | 0.203 | 0.723 |
| 400 | 219.0 | 0.243 | 0.717 |
| 500 | 209.7 | 0.322 | 0.660 |
| 600 | 150.7 | 0.408 | 0.583 |
| 700 | 96.0 | 0.484 | 0.512 |
| 800 | 56.3 | 0.544 | 0.452 |
| 900 | 30.8 | 0.585 | 0.410 |
| 1000 | 16.3 | 0.602 | 0.386 |
| 1100 | 9.5 | 0.571 | 0.392 |
| 1200 | 8.1 | 0.452 | 0.461 |
| 1300 | 11.2 | 0.292 | 0.574 |
| 1400 | 20.5 | 0.199 | 0.657 |
| 1500 | 41.6 | 0.162 | 0.709 |
| 1600 | 85.3 | 0.155 | 0.748 |
| 1700 | 143.3 | 0.181 | 0.760 |
| 1800 | 172.1 | 0.234 | 0.733 |
| 1900 | 162.1 | 0.303 | 0.681 |
| | 135.6 | 0.372 | 0.619 |

Referring to FIGS. 12A and 12B and Table 1, it can be seen that, in the first form of the fifth embodiment of the present invention, when the reflective electrode layer of the reflective anode 1100 in each emission part is made of an APC alloy, and the cathode 140 in each emission part is made of an AgMg alloy, for example, the green emission part GE having the best visibility exhibits a best efficiency of 219.6 Cd/A under the condition that the thickness of the second hole transport layer HTL2 in the second sub-stack S2 is 400 Å, and the color coordinates CIEx and CIEy in this case are 0.243 and 0.717, respectively, and, as such, superior color coordinate characteristics are exhibited for green wavelengths.

Referring to Tables 1 and 2, it can also be seen that each emission part of the display device according to the present invention exhibits a considerable variation in color coordinate characteristics, irrespective of the material of the cathode 140, when the thickness of the second hole transport layer HTL2 exceeds 400 Å.

TABLE 2

Reflective Anode (APC)/Cathode (AgMg)

| HTL2 (Å) | Efficiency (Cd/A) | CIEx | CIEy |
|---|---|---|---|
| 100 | 64.6 | 0.212 | 0.699 |
| 200 | 120.9 | 0.221 | 0.707 |
| 300 | 191.2 | 0.240 | 0.707 |
| 400 | 233.7 | 0.280 | 0.686 |
| 500 | 220.3 | 0.336 | 0.644 |
| 600 | 173.3 | 0.398 | 0.591 |
| 700 | 122.4 | 0.456 | 0.537 |
| 800 | 80.1 | 0.509 | 0.486 |
| 900 | 49.3 | 0.522 | 0.442 |
| 1000 | 29.5 | 0.577 | 0.410 |
| 1100 | 19.4 | 0.556 | 0.410 |
| 1200 | 18.0 | 0.444 | 0.480 |
| 1300 | 25.9 | 0.289 | 0.602 |
| 1400 | 45.4 | 0.201 | 0.688 |
| 1500 | 80.5 | 0.178 | 0.728 |
| 1600 | 140.0 | 0.192 | 0.743 |
| 1700 | 175.8 | 0.217 | 0.735 |
| 1800 | 195.7 | 0.263 | 0.708 |
| 1900 | 186.5 | 0.317 | 0.665 |

Referring to FIGS. 13A and 13B and Table 2, it can be seen that, in each emission part in the second form of the fifth embodiment of the present invention, when the reflective electrode layer of the reflective anode 1100 is made of an APC alloy, and the cathode 140 is made of IZO, for example, the green emission part GE having the best visibility exhibits best efficiencies of 191.2 Cd/A and 233.7 Cd/A under the condition that the thickness of the second hole transport layer HTL2 in the second sub-stack S2 is 300 Å to 400 Å, and the color coordinates CIEx and CIEy in this case are 0.240 and 0.707 or 0.280 and 0.686, respectively, and, as such, superior color coordinate characteristics are exhibited for green wavelengths.

The above-described experiments carried out for the forms of the fifth embodiment of the display device according to the present invention are adapted to find an effective position of the light emitting layer in each organic light emitting element having a facing electrode structure including a reflective anode and a semi-transmissive or transmissive cathode in each emission part. Whether or not the position of the light emitting layer in the transmission part T/E having a facing electrode structure (a transparent anode and a cathode) different from that of each emission part E is suitable will be observed through the following experiments.

The display device of the present invention used in the following experiments may correspond not only to the fifth embodiment, but also to various forms of the fourth embodiment described with reference to FIGS. 8 to 10. In this regard, the interlayer structure used in each emission part E of the display device may have a red emission part RE and a blue emission part BE or may have red, green and blue emission parts RE, BE and GE. The display device also has a difference in that the display device further includes the transmission part T/E. In addition, the transmission part T/E is identical to the green emission part GE in the configuration of the first organic stack 130 included in the emission part E, except that an optical compensation layer 1345 or 1305 or an optical compensation layer 1305/1345 is further included in the transmission part T/E.

Figure 14A:
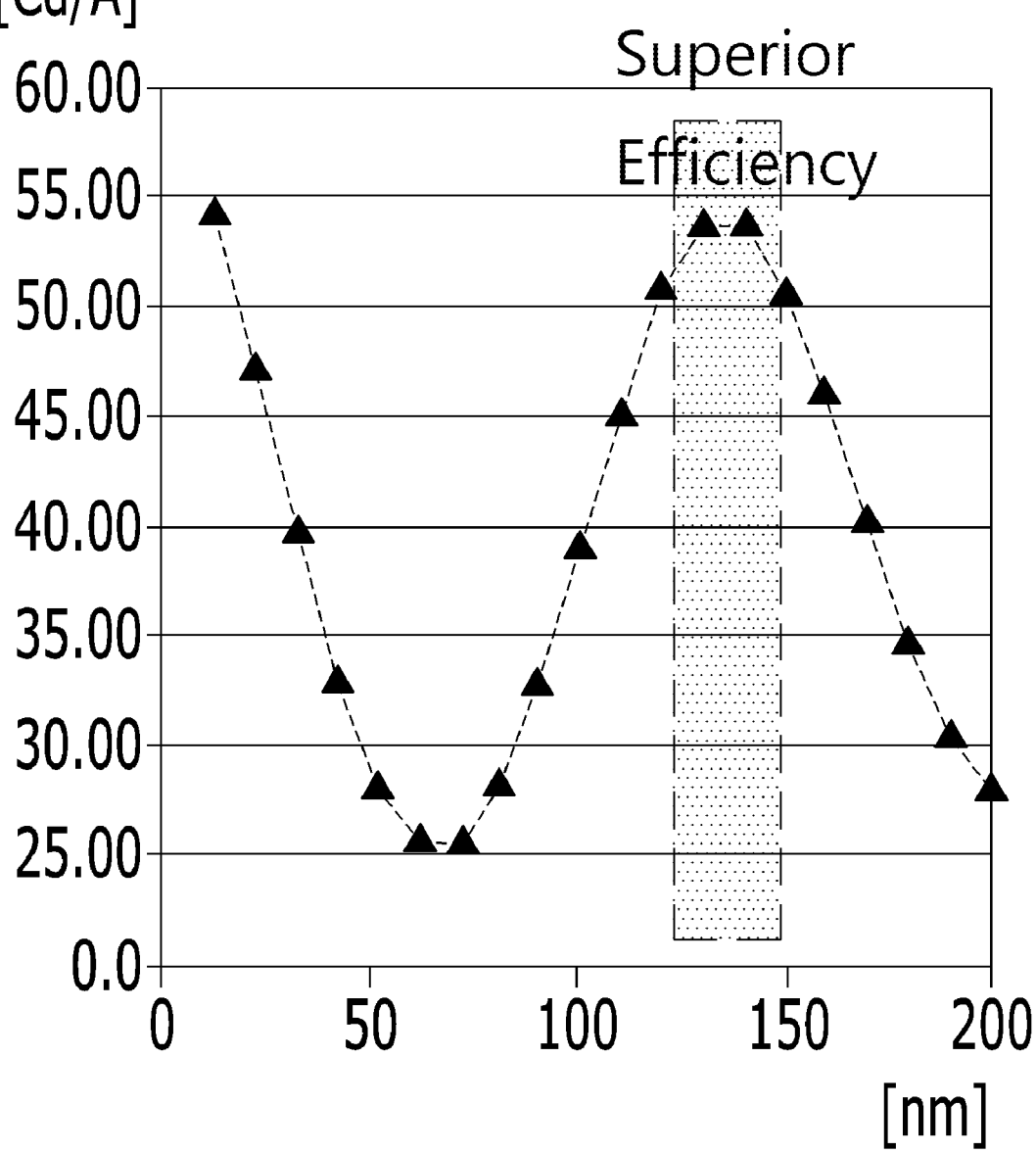
FIGS. 14A and 14B are graphs depicting the efficiency and CIE characteristics in a transmission part of a display device according to the second form of the fifth embodiment of the present invention, respectively.
Figure 14B:
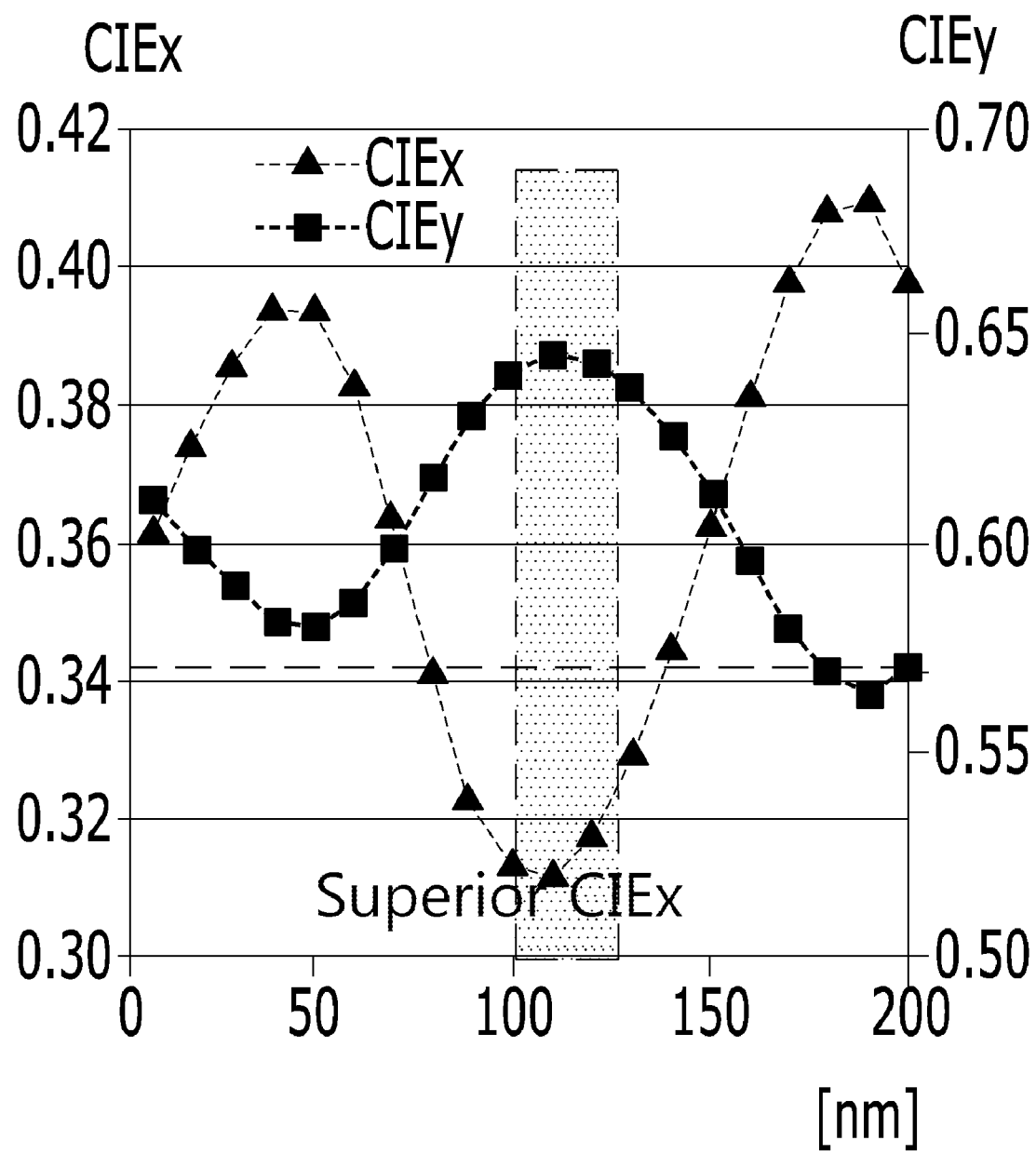

FIGS. 14A and 14B are graphs depicting the efficiency and CIE characteristics in the transmission part of the display device according to the second form of the fifth embodiment of the present invention, respectively.

The transmission part T/E according to the second form of the fifth embodiment of the present invention further includes the optical compensation layer 1345 arranged beneath the second sub-stack-associated light emitting layer 1353 of the second sub-stack S2'. The material of the optical compensation layer 1345 is the same as the material of the second hole transport layer HTL2 in experiments carried out in this case and, as such, second hole transport layers HTL2 having a thickness of more than 400 Å in Table 3 are considered optical compensation layers.

In addition, in this case, the transparent anode 1200 has a layered structure including transparent anodes 112a and 112b, which are also provided at the reflective anode 1100 and, as such, is made of ITO while having a total thickness of 140 Å.

TABLE 3

Transparent Anode (ITO)/Cathode (IZO)

| HTL2 (Å) | Efficiency (Cd/A) | CIEx | CIEy |
|---|---|---|---|
| 100 | 54.41 | 0.36 | 0.61 |
| 200 | 47.43 | 0.375 | 0.60 |
| 300 | 39.93 | 0.387 | 0.59 |

TABLE 3-continued

Transparent Anode (ITO)/Cathode (IZO)

| HTL2 (Å) | Efficiency (Cd/A) | CIEx | CIEy |
|---|---|---|---|
| 400 | 33.27 | 0.394 | 0.58 |
| 500 | 28.38 | 0.394 | 0.58 |
| 600 | 25.82 | 0.383 | 0.59 |
| 700 | 25.80 | 0.364 | 0.60 |
| 800 | 28.29 | 0.342 | 0.62 |
| 900 | 32.95 | 0.324 | 0.63 |
| 1000 | 39.07 | 0.314 | 0.64 |
| 1100 | 45.53 | 0.312 | 0.65 |
| 1200 | 50.90 | 0.32 | 0.64 |
| 1300 | 53.87 | 0.33 | 0.64 |
| 1400 | 53.78 | 0.345 | 0.6259 |
| 1500 | 50.84 | 0.363 | 0.6115 |
| 1600 | 45.93 | 0.382 | 0.596 |
| 1700 | 40.23 | 0.398 | 0.580 |
| 1800 | 34.84 | 0.409 | 0.569 |
| 1900 | 30.66 | 0.410 | 0.564 |
| 2000 | 28.30 | 0.398 | 0.569 |

That is, as illustrated in FIGS. 14A and 14B and Table 3, the transmission part T/E in the second form of the fifth embodiment of the present invention (FIG. 8) includes, as an anode thereof, a transparent anode constituted by transparent electrodes made of, for example, ITO, while including a cathode made of IZO, as in Table 2. The transparent anode and the cathode face each other. The transmission part T/E also includes first and second sub-stacks S1 and S2' arranged between the transparent anode and the cathode. In this case, the position of the second hole transport layer in the transmission part T/E differs from the position of the second hole transport layer arranged beneath the light emitting layer of the second sub-stack in each emission part E and, as such, the transmission part T/E has an emission efficiency and color coordinate characteristics different from those of the emission part E. That is, the emission part E exhibits maximum efficiency when the second hole transport layer HTL2 thereof has a thickness of 300 Å to 400 Å, whereas the transmission part T/E exhibits maximum efficiency and color coordinate characteristics suitable for green emission when the second hole transport layer HTL2 thereof has a thickness of 1,100 Å to 1,300 Å. This means that, when the emission part E has an optimum green emission efficiency at a thickness of the second hole transport layer HTL2 corresponding to 400 Å, the transmission part T/E may have an optimum emission efficiency under the condition that the position of the light emitting layer in the transmission part T/E differs from that of the emission part E, because the transmission part T/E has a transparent anode configuration different from that of the emission part E. In particular, this means that the light emitting layer of the transmission part T/E should be arranged at a position higher than that of the light emitting layer in the emission part E by a thickness of 700 Å to 900 Å. In this case, the arrangement of the light emitting layer in the transmission part T/E at a higher position than that of the emission part E may be achieved by providing an optical compensation layer 1345 (FIG. 8) having a thickness of 700 Å to 900 Å at the second sub-stack S2'. In experimental examples, the optical compensation layer is made of the same material as the second hole transport layer HTL2.

As such, when the display device according to the second form of the fifth embodiment of the present invention includes emission parts and transmission parts, the display device may have an efficiency of 200 Cd/A or more during emission driving in accordance with a top emission configuration of each emission part. In addition to the efficiency obtained by each emission part, an additional efficiency of 40 Cd/A may be obtained by each transmission part provided with the optical compensation layer. Thus, an enhancement in emission efficiency may be exhibited in the entire zone of the substrate.

Figure 15A:
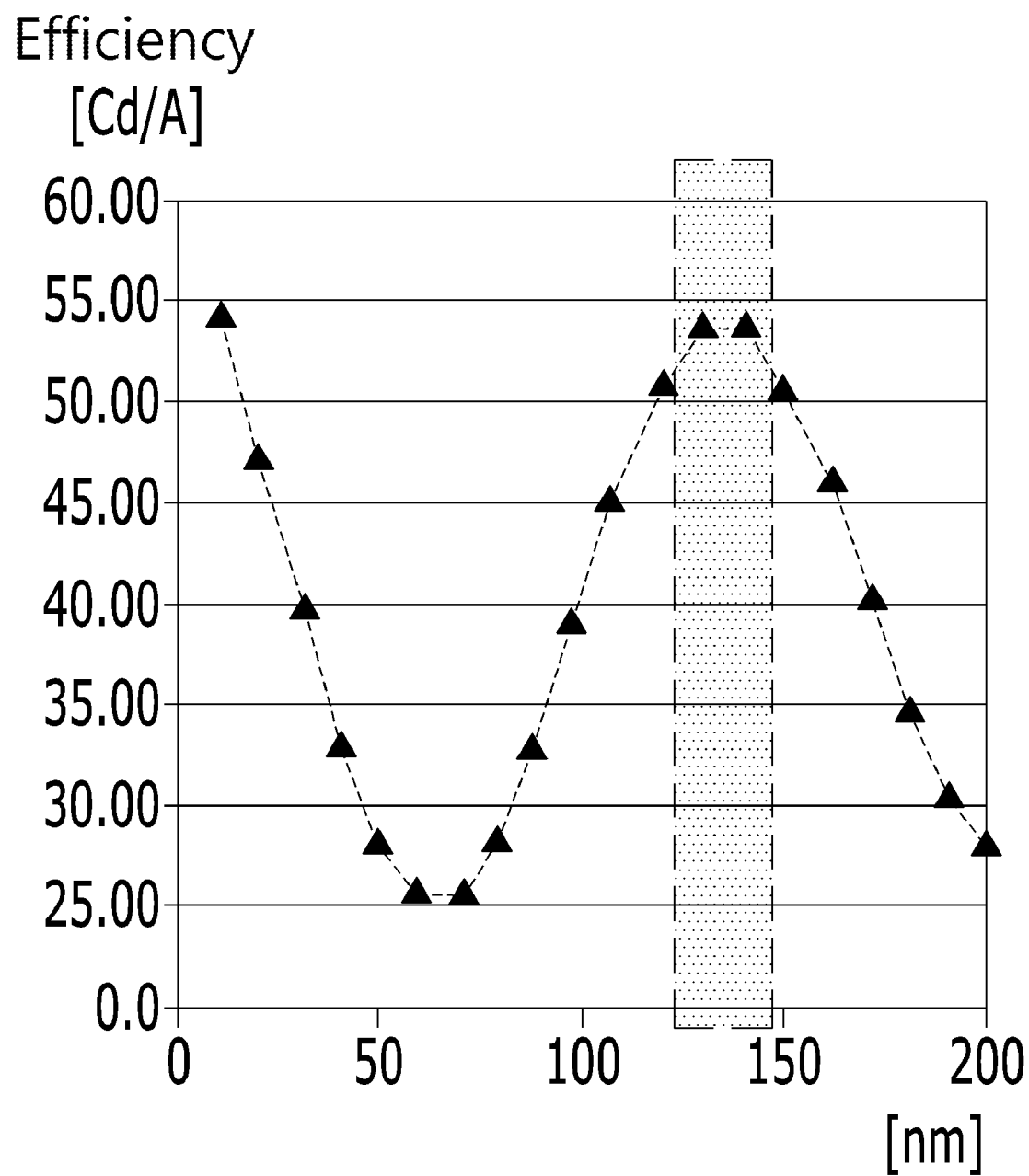
FIGS. 15A and 15B are graphs depicting the efficiency and CIE characteristics in a transmission part of a display device according to a third form of the fifth embodiment of the present invention, respectively.
Figure 15B:
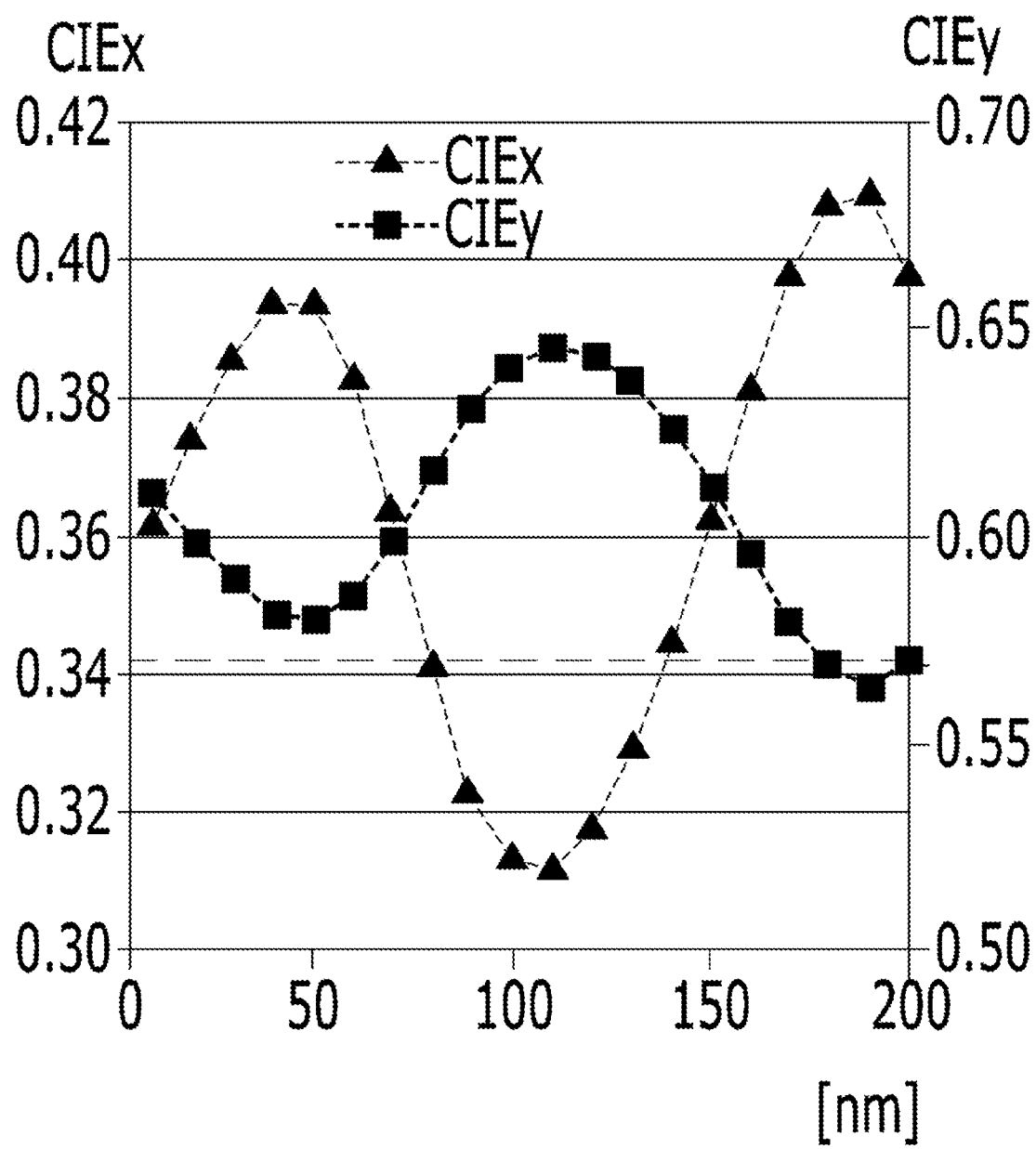

FIGS. 15A and 15B are graphs depicting the efficiency and CIE characteristics in the transmission part of the display device according to the third form of the fifth embodiment of the present invention, respectively.

TABLE 4

Transparent Anode (ITO)/Cathode (IZO) (HTL1 Modified)

| HTL1 (Å) | Efficiency (Cd/A) | CIEx | CIEy |
|---|---|---|---|
| 100 | 37.93 | 0.38 | 0.60 |
| 200 | 34.60 | 0.386 | 0.59 |
| 300 | 31.21 | 0.392 | 0.58 |
| 400 | 28.38 | 0.394 | 0.58 |
| 500 | 26.56 | 0.389 | 0.58 |
| 600 | 25.96 | 0.379 | 0.59 |
| 700 | 26.66 | 0.365 | 0.60 |
| 800 | 28.76 | 0.350 | 0.61 |
| 900 | 31.24 | 0.340 | 0.62 |
| 1000 | 34.33 | 0.335 | 0.63 |
| 1100 | 37.15 | 0.336 | 0.63 |
| 1200 | 39.10 | 0.34 | 0.63 |
| 1300 | 39.75 | 0.35 | 0.62 |
| 1400 | 39.02 | 0.364 | 0.6086 |
| 1500 | 37.15 | 0.378 | 0.5974 |
| 1600 | 34.88 | 0.388 | 0.587 |
| 1700 | 29.65 | 0.401 | 0.573 |

FIGS. 15A and 15B are associated with the case in which the transmission part T/E includes an optical compensation layer arranged beneath the light emitting layer in the first sub-stack S1' while contacting the light emitting layer. In this case, the vertical position of the light emitting layer is varied through adjustment of the thickness of the first hole transport layer HTL1.

In this case, in association with the first sub-stacks S1 and S1, the emission part E has an optimum efficiency at a predetermined thickness of the second hole transport layer HTL2 as shown in Table 2, whereas the transmission part T/E has an optimum efficiency when the first hole transport layer HTL1 thereof has a thickness of 1,100 Å to 1,300 Å as shown in Table 4. Accordingly, it can be seen that the hole transport layers exhibiting optimum efficiencies in the emission part E and the transmission part T/E have a thickness difference of 700 Å to 900 Å. In this regard, the transmission part T/E may obtain an optimum emission efficiency by additionally forming an optical compensation layer to a thickness of 700 Å to 900 Å using the same material as the hole transport layer HTL1 after formation of the hole transport layer HTL1, as compared to the emission part E. This means that the optical compensation layer 1305 is applied to the structure of FIG. 9 in such a manner that the optical compensation layer 1305 is formed to a thickness of 700 Å to 900 Å beneath the first sub-stack-associated light emitting layer 1313, using a hole transport material.

Even in the third form of the fifth embodiment of the present invention, an additional emission efficiency may be obtained in the transmission part T/E, in addition to the emission part E. Accordingly, an enhancement in emission efficiency may be achieved in the entirety of the display device.

Meanwhile, as in the third form of the fourth embodiment of the present invention illustrated in FIG. 10, it may be possible to provide optical compensation layers 1305 and 1345 at the stacks S1' and S2' included in the transmission part T/E, respectively.

TABLE 5

Transparent Anode (ITO)/Cathode (IZO) (HTL1 & HTL2 Modified)

| HTL1 (Å) | HTL2 (Å) | Efficiency (Cd/A) | CIEx | CIEy |
|---|---|---|---|---|
| 400 | 500 | 28.38 | 0.394 | 0.580 |
| 500 | 600 | 25.22 | 0.372 | 0.593 |
| 600 | 700 | 28.60 | 0.335 | 0.621 |
| 700 | 800 | 37.06 | 0.315 | 0.641 |
| 900 | 1000 | 50.46 | 0.337 | 0.631 |
| 1000 | 1100 | 48.29 | 0.362 | 0.610 |
| 1100 | 1200 | 44.08 | 0.374 | 0.597 |
| 1200 | 1300 | 40.88 | 0.372 | 0.597 |
| 1300 | 1400 | 41.14 | 0.355 | 0.611 |

Referring to FIG. 10 and Table 5, it can be seen that, when the first hole transport layer of the first sub-stack and the second hole transport layer of the second sub-stack, which have 900 Å and 1,000 Å, respectively, are arranged beneath the light emitting layers Green1 and Green2 in the transmission part T/E, an optimum efficiency and optimum color coordinate characteristics are obtained, as compared to the case in which each of the first and second hole transport layers HTL1 and HTL2 is provided to a thickness of 400 Å in the emission part E.

The greater hole transport layer thickness of the transmission part T/E than that of the emission part E means that, under the condition that the emission part E and the transmission part T/E have light emitting layers having the same thickness, respectively, the transmission part T/E is additionally provided with the first optical compensation layer 1305 formed to a thickness of 500 Å in the first sub-stack S1', and the second optical compensation layer 1345 formed to a thickness of 600 Å in the second sub-stack S2'. That is, first and second hole transport layers HTL1 and HTL2 each having a thickness of 400 Å are provided in common at the emission part E and the transmission part T/E, and optical compensation layers having thicknesses of 500 Å and 600 Å are formed at the transmission part T/E using the same material as the hole transport layers, before formation of light emitting layers Green1 and Green 2 in the transmission part T/E.

Meanwhile, in the above-described example, when the emission part E and the transmission part T/E include green light emitting layers emitting the same color, respectively, appropriate positions of the green light emitting layers are taken into consideration in association with the emission part E and the transmission part T/E. If light emitting layers of different colors, for example, a blue light emitting layer and a red light emitting layer, are provided at the emission part and the transmission part, respectively, optical compensation layers having thicknesses different from those of the above-described example may be needed. This will be described with reference to experiments.

In the case in which light emitting layers provided at the emission part E and the transmission part T/E are blue light emitting layers, respectively, an optimum blue emission efficiency is obtained in the emission part E, which has a facing electrode structure including a reflective anode (APC) and a cathode (IZO), when the hole transport layer HTL1 of the emission part E has a thickness of about 20 nm (200 Å) to about 40 nm (400 Å).

TABLE 6

Reflective Anode (APC)/Cathode (IZO)

| HTL1 (nm) | Efficiency (Cd/A) | CIEx | CIEy |
|---|---|---|---|
| 10 | 2.9 | 0.145 | 0.044 |
| 20 | 5.5 | 0.139 | 0.055 |
| 30 | 7.9 | 0.129 | 0.081 |
| 40 | 8.8 | 0.118 | 0.130 |
| 50 | 7.8 | 0.109 | 0.206 |
| 60 | 6.0 | 0.109 | 0.307 |
| 70 | 4.1 | 0.127 | 0.396 |
| 80 | 2.7 | 0.159 | 0.310 |
| 90 | 1.9 | 0.164 | 0.129 |
| 100 | 1.9 | 0.157 | 0.060 |
| 110 | 2.6 | 0.153 | 0.043 |
| 120 | 4.0 | 0.149 | 0.041 |
| 130 | 5.6 | 0.143 | 0.047 |
| 140 | 7.0 | 0.136 | 0.063 |
| 150 | 7.8 | 0.126 | 0.092 |
| 160 | 8.0 | 0.113 | 0.145 |
| 170 | 7.5 | 0.100 | 0.231 |
| 180 | 6.4 | 0.095 | 0.335 |

On the other hand, even in the case in which the transmission part T/E having a facing electrode structure including a transparent anode (ITO) and a cathode (IZO) has the same configuration as the blue emission part to emit blue, the transmission part T/E may exhibit an optimum emission efficiency and optimum color coordinate characteristics, when the first hole transport layer HTL1 has a thickness of 100 to 120 nm. That is, the experiments of Tables 6 and 7 mean that an appropriate blue emission efficiency may be obtained in the transmission part T/E, when the transmission part T/E is provided with an additional thickness of 60 nm to 100 nm by the optical compensation layer, as compared to the emission part E.

TABLE 7

Transparent Anode (ITO)/Cathode (IZO) (HTL1 Modified)

| HTL1 (nm) | Efficiency (Cd/A) | CIEx | CIEy |
|---|---|---|---|
| 10 | 2.3 | 0.135 | 0.113 |
| 20 | 2.1 | 0.136 | 0.119 |
| 30 | 1.9 | 0.137 | 0.121 |
| 40 | 1.8 | 0.139 | 0.116 |
| 50 | 1.7 | 0.140 | 0.107 |
| 60 | 1.8 | 0.141 | 0.097 |
| 70 | 1.9 | 0.141 | 0.090 |
| 80 | 2.1 | 0.140 | 0.087 |
| 90 | 2.2 | 0.139 | 0.088 |
| 100 | 2.3 | 0.137 | 0.093 |
| 110 | 2.4 | 0.135 | 0.102 |
| 120 | 2.3 | 0.134 | 0.113 |
| 130 | 2.2 | 0.133 | 0.123 |
| 140 | 2.1 | 0.134 | 0.128 |
| 150 | 2.0 | 0.137 | 0.126 |
| 160 | 1.9 | 0.139 | 0.115 |
| 170 | 1.8 | 0.141 | 0.102 |

In the case in which light emitting layers provided at the emission part E and the transmission part T/E are red light emitting layers, respectively, an optimum red emission efficiency is obtained in the emission part E, which has a facing electrode structure including a reflective anode (APC) and a cathode (IZO), when the hole transport layer HTL1 of the emission part E has a thickness of about 40 nm (400 Å), as illustrated in Table 8.

On the other hand, even in the case in which the transmission part T/E having a facing electrode structure including a transparent anode (ITO) and a cathode (IZO) has the same configuration as the red emission part to emit red, the transmission part T/E may exhibit an optimum emission efficiency and optimum color coordinate characteristics, when the first hole transport layer HTL1 has a thickness of 110 nm to 140 nm. That is, the experiments of Tables 8 and 9 mean that an appropriate red emission efficiency may be obtained in the transmission part T/E, when the transmission part T/E is provided with an additional thickness of 70 to 100 nm by the optical compensation layer, as compared to the emission part E.

TABLE 8

Reflective Anode (APC)/Cathode (IZO)

| HTL1 (nm) | Efficiency (Cd/A) | CIEx | CIEy |
| --- | --- | --- | --- |
| 10 | 18.22 | 0.655 | 0.342 |
| 20 | 20.76 | 0.664 | 0.333 |
| 30 | 19.07 | 0.673 | 0.324 |
| 40 | 14.44 | 0.680 | 0.317 |
| 50 | 9.48 | 0.685 | 0.310 |
| 60 | 5.63 | 0.687 | 0.305 |
| 70 | 3.04 | 0.686 | 0.297 |
| 80 | 1.46 | 0.675 | 0.285 |
| 90 | 0.64 | 0.639 | 0.269 |
| 100 | 0.47 | 0.579 | 0.294 |
| 110 | 0.92 | 0.585 | 0.347 |
| 120 | 2.07 | 0.609 | 0.361 |
| 130 | 4.09 | 0.621 | 0.363 |
| 140 | 7.22 | 0.629 | 0.362 |
| 150 | 11.54 | 0.636 | 0.358 |
| 160 | 16.61 | 0.644 | 0.352 |
| 170 | 21.01 | 0.653 | 0.343 |
| 180 | 22.84 | 0.663 | 0.333 |
| 190 | 21.18 | 0.673 | 0.324 |
| 200 | 16.89 | 0.681 | 0.315 |

TABLE 9

Transparent Anode (ITO)/Cathode (IZO) (HTL1 Modified)

| HTL1 (nm) | Efficiency (Cd/A) | CIEx | CIEy |
| --- | --- | --- | --- |
| 10 | 2.793 | 0.661 | 0.322 |
| 20 | 2.591 | 0.660 | 0.322 |
| 30 | 2.488 | 0.658 | 0.323 |
| 40 | 2.492 | 0.656 | 0.324 |
| 50 | 2.599 | 0.655 | 0.326 |
| 60 | 2.797 | 0.655 | 0.328 |
| 70 | 3.061 | 0.655 | 0.329 |
| 80 | 3.354 | 0.656 | 0.330 |
| 90 | 3.634 | 0.657 | 0.330 |
| 100 | 3.854 | 0.658 | 0.329 |
| 110 | 3.974 | 0.660 | 0.328 |
| 120 | 3.972 | 0.661 | 0.327 |
| 130 | 3.849 | 0.663 | 0.325 |
| 140 | 3.629 | 0.663 | 0.323 |
| 150 | 3.351 | 0.664 | 0.322 |
| 160 | 3.062 | 0.664 | 0.321 |
| 170 | 2.804 | 0.663 | 0.321 |
| 180 | 2.612 | 0.661 | 0.321 |
| 190 | 2.507 | 0.659 | 0.323 |
| 200 | 2.500 | 0.656 | 0.325 |

That is, referring to results of the experiments respectively carried out for the emission part E and the transmission part T/E under the condition that light emitting layers of the same color are applied to the emission part E and the transmission part T/E, respectively, it can be seen that the transmission part T/E may have an optimum emission efficiency when the transmission part T/E is additionally provided with an optical compensation layer having a thickness of 500 Å to 1,100 Å, as compared to the emission part E. Meanwhile, the above-described experimental examples show results of experiments carried out for the case in which organic light emitting elements OLED1 and OLED2 in each of the emission part E and the transmission part T/E are provided through two stack structures, respectively. When the organic light emitting elements OLED1 and OLED2 are provided through a single stack structure, the thickness of the optical compensation layer may be reduced to 400 Å. On the other hand, when organic light emitting elements OLED1 and OLED2 are provided at each of the emission part E and the transmission part T/E under the condition that different light emitting layers are provided at the emission part E (red and blue light emitting layers) and the transmission part T/E (green light emitting layer), the optical compensation layer additionally provided at the transmission part T/E may have an upper thickness limit up to 1,200 Å.

Hereinafter, emission zones of the display device of the present invention will be compared with those of a comparative example.

Figure 16A:
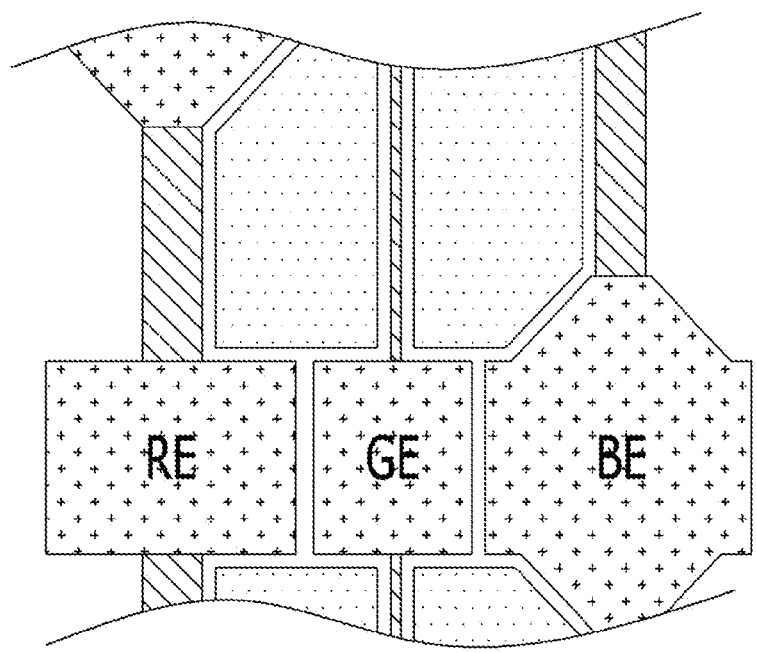
FIGS. 16A and 16B are plan views illustrating a display device according to a comparative example and a display device according to an embodiment of the present invention, respectively.
Figure 16B:
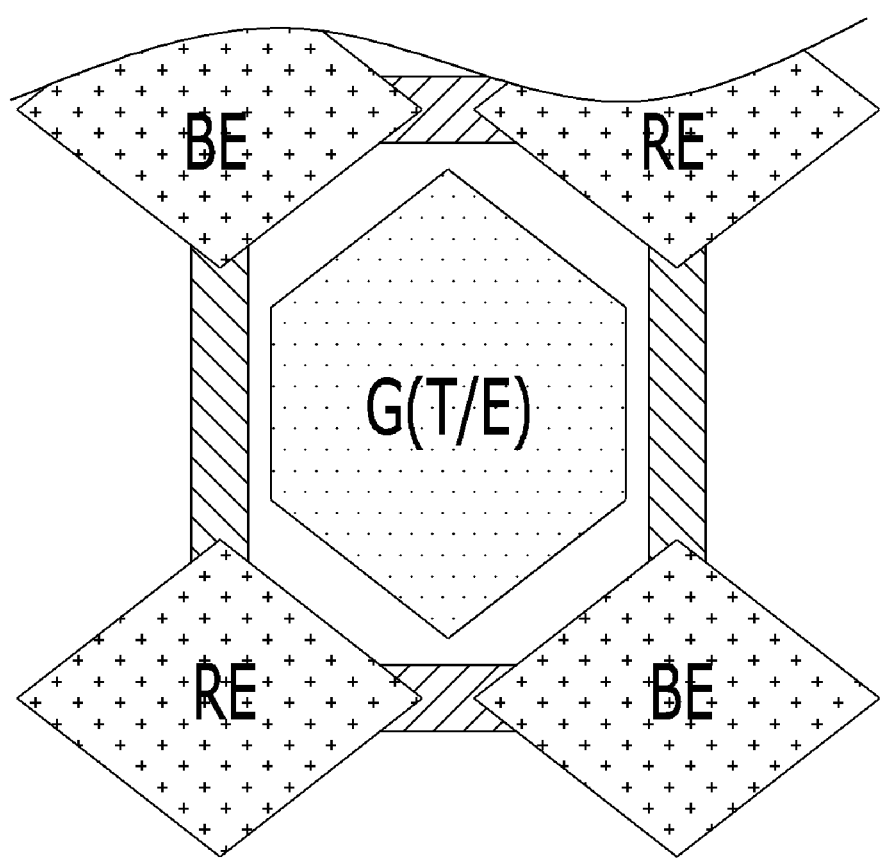

FIGS. 16A and 16B illustrate plan views of a display device according to a comparative example and a display device according to an embodiment of the present invention, respectively.

FIG. 16A illustrates the display device according to the comparative example. As illustrated in FIG. 16A, the display device according to the comparative example has a configuration in which an anode and a light emitting layer are eliminated from a transmission part E, to provide a desired transparency to the transmission part E. In this case, red, green and blue emission zones of the emission part E have emission areas corresponding to about 20% of an active area AA when the area shielded by arrangement of lines SL and DL is excluded, due to the above-described configuration of the transmission part E.

On the other hand, as illustrated in FIG. 16B, in the display device of the present invention, the transmission part T/E thereof also functions as an emission part G(TE), in addition to zones BE and RE corresponding to respective emission parts E. In this case, although the transmission part T/E exhibits a relatively degraded emission efficiency due to double-sided transmission thereof, most areas of the transmission part T/E, except for banks 150 (FIG. 3) between the emission part E and the transmission part T/E, may be used as an emission zone. Accordingly, the transmission part T/E may secure an emission area corresponding to about 66.8% of the active area AA. Thus, it can be seen that an enhancement in emission efficiency may be achieved in the display device.

Hereinafter, another planar layout of the display device according to the present invention will be described.

Figure 17:
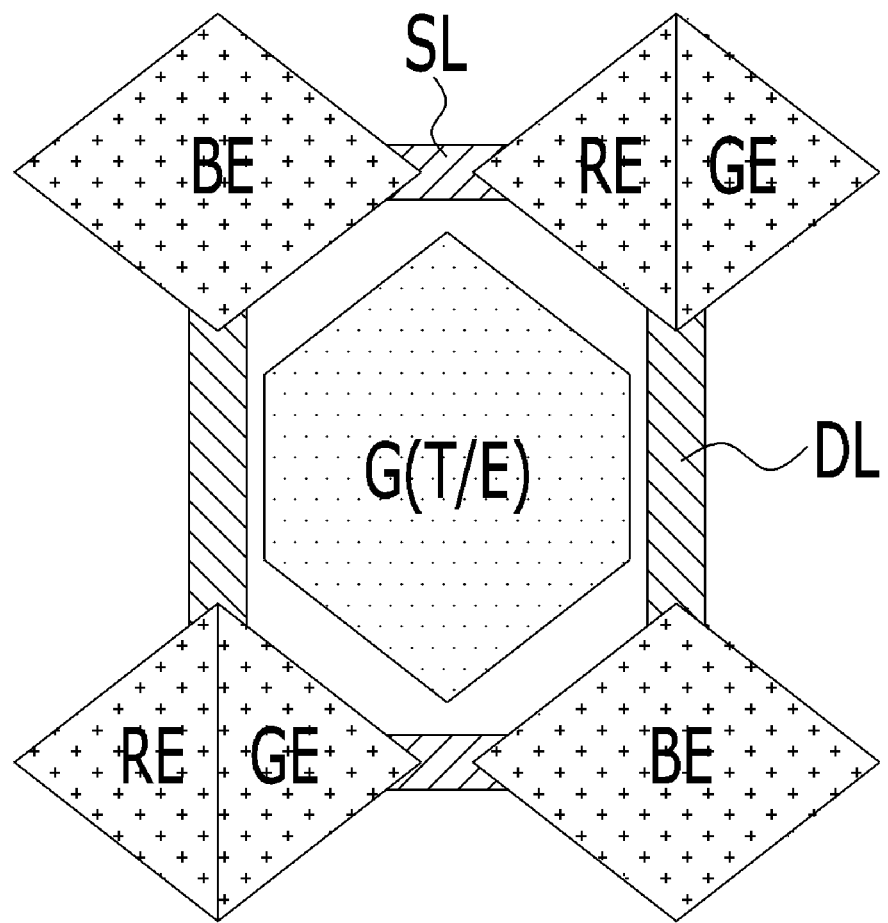
FIGS. 17 and 18 are plan views illustrating display devices according to sixth and seventh embodiments of the present invention, respectively.
Figure 18:
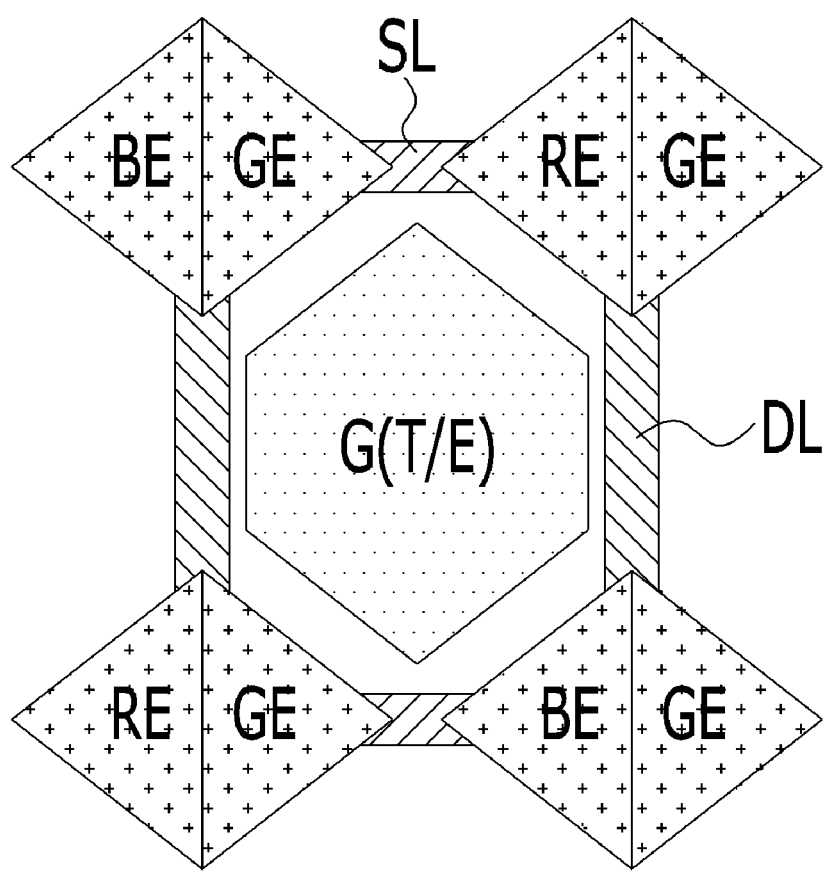

FIGS. 17 and 18 are plan views illustrating sixth and seventh embodiments of the present invention, respectively.

FIG. 17 illustrates a display device according to the sixth embodiment of the present invention. In this case, the structure of the second organic stack 130' (FIG. 1), which includes a green light emitting layer having a high emission efficiency, is applied to the transmission part T/E, and the emission part E includes a green emission zone GE having the structure of a first organic stack 130 (FIG. 1), which includes a green light emitting layer, in addition to a red emission zone RE having the structure of a first organic stack 130 (FIG. 1), which includes a red light emitting layer, and a blue emission zone BE having the structure of a first organic stack 130 (FIG. 1), which includes a blue light emitting layer.

In this case, the red, green and blue emission zones RE, GE and BE are spaced apart from one another in a plane. The green light emitting layer arranged in the transmission part G(T/E) may be spaced apart from the red, green and blue light emitting layers of the red, green and blue emission zones or parts RE, GE and BE.

Although the red emission zone RE and the green emission zone GE in the emission part E are illustrated as contacting each other in a plane in FIG. 17, a bank (not shown) may be arranged between the red emission zone RE and the green emission zone GE in each organic stack such that the red emission zone RE and the green emission zone GE are spaced apart from each other, in order to prevent color mixture during light emission.

In this case, a relatively large area is allocated to the blue emission zone BE having a relative low emission efficiency in the emission part E, as compared to other zones of the emission part E. The structure of the first organic stack 130 in each of the red and green emission zones RE and GE is allocated an area half divided from the structure of the first organic stack 130 in the blue emission zone BE.

In this case, each of emission parts of different colors may have a thin film transistor to drive the emission part, and may further have the configuration of a thin film transistor included in an emission part arranged adjacent to the former emission part.

FIG. 18 illustrates a display device according to the seventh embodiment of the present invention. In this display device, each of the emission parts E is half divided such that emission zones of different colors are arranged adjacent to each other in the emission part E, differently from the structure of FIG. 2. Furthermore, the transmission part is provided with a central green emission zone, and a red emission zone or a blue emission zone is arranged adjacent to a green emission zone in each emission part.

Although the seventh embodiment illustrates that the red emission zone RE or the blue emission zone BE is arranged adjacent to the green emission zone GE in each emission part, the green light emitting layer and the red or blue light emitting layer provided at each emission zone may be spaced apart from each other by a bank provided between the adjacent layers.

In addition, in the seventh embodiment, emission parts are arranged at left upper and right lower positions in one diagonal direction and right upper and left lower positions in the other diagonal direction with respect to each transmission part T/E. Spacings between the transmission part T/E and respective emission parts GE, RE and BE may be equal.

In the seventh embodiment illustrated in FIG. 18, green emission zones are arranged at the emission parts arranged at left upper and right lower positions in one diagonal direction and right upper and left lower positions in the other diagonal direction with respect to each transmission part and, as such, have the greatest area, as compared to the red and blue emission zones. As a green emission zone having a large area is provided at the display device, as described above, it may be possible to achieve an enhancement in emission efficiency because green exhibits highest visibility. In this case, each of the emission parts of different colors may include the configuration of the thin film transistor provided for driving the transmission part arranged adjacent to the emission part, in addition to the thin film transistor for driving the emission part.

In the plan view, the emission parts E and the transmission part T/E are mainly shown, and circuit configurations such as thin film transistors are omitted. As described above with reference to FIGS. 1 to 3, thin film transistors and storage capacitors may be disposed beneath the bank 150 arranged between adjacent ones of the emission parts E or between each emission part E and the transmission part T/E and, as such, may be prevented from being visible.

Hereinafter, a display device according to another embodiment will be described.

Figure 19:
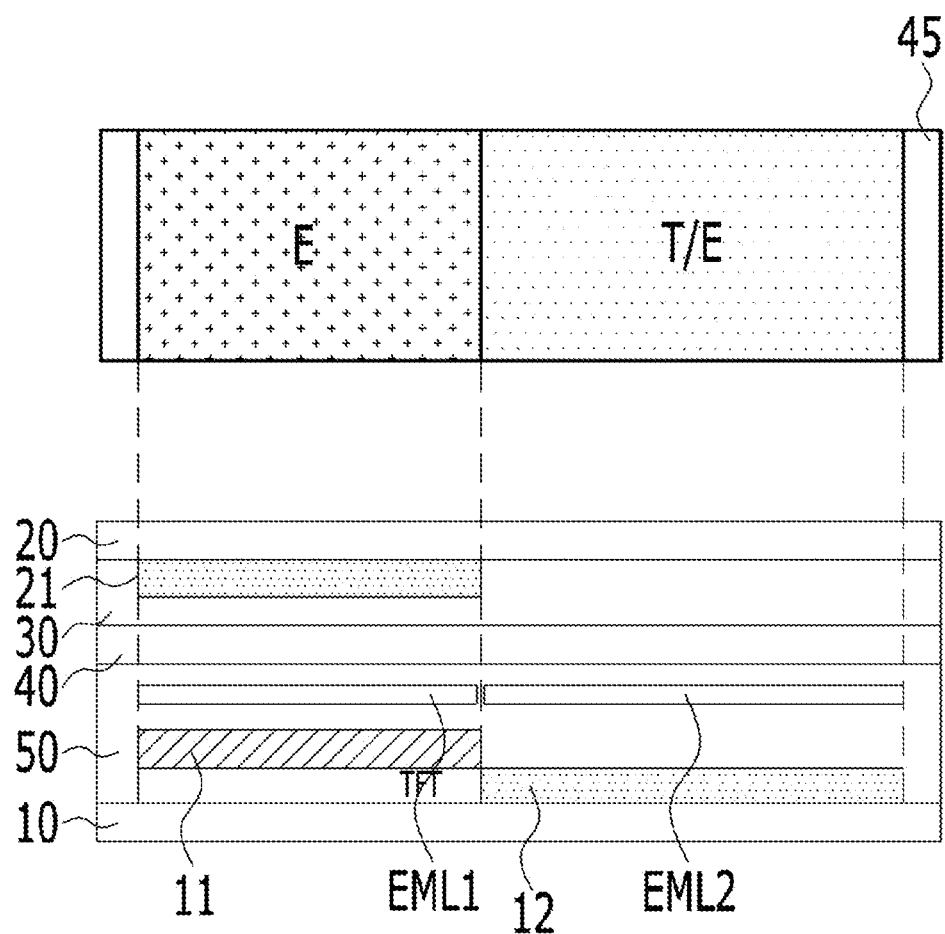
FIG. 19 is a cross-sectional view illustrating a display device according to an eighth embodiment of the present invention.

FIG. 19 is a cross-sectional view illustrating a display device according to an eighth embodiment of the present invention.

As illustrated in FIG. 19, in the display device according to the eighth embodiment of the present invention, a single thin film transistor TFT is provided at an emission part E in order to drive a transmission part T/E as well as the emission part E. A transparent anode 12 and a reflective anode 11, which are provided at the adjacent transmission part T/E and emission part E, respectively, are connected to the thin film transistor TFT, and, as such, both the transmission part T/E and the emission part E are driven by the thin film transistor TFT. If necessary, display of the emission part E and display of the transmission part T/E may be selectively carried out through time division of the thin film transistor TFT.

In this case, the display device according to the eighth embodiment of the present invention includes an organic stack 50 and a cathode 40 arranged, for an emission part E, on a transparent substrate 10 divided into the emission part E and a transmission part T/E, and an organic stack 50 and a cathode 40 arranged, for the transmission part T/E, on the transparent substrate 10. The organic stack 50 of the emission part E includes a thin film transistor TFT, a reflective electrode 11, and a first light emitting layer EML1. The organic stack 50 of the transmission part T/E includes a transparent electrode 12 and a second light emitting layer EML2.

At an opposite transparent substrate 20, a color filter layer 21 corresponding to the emission part E is provided. An encapsulation layer 30 is provided between the transparent substrate 10 and the opposite transparent substrate 20.

Reference numeral "45" designates a region other than the emission part E and the transmission part T/E. The region 45 is a region to shield shading elements such as lines and to divide regions of neighboring pixels.

Meanwhile, although organic light emitting layers have been described as light emitting layers in the above-described embodiments, the present invention is not limited to such organic light emitting layers. For example, inorganic light emitting layers such as quantum dot light emitting layers may be formed as a substitute.

In addition, in the display device of the present invention, respective organic light emitting elements OLED1 and OLED2 of the emission part and the transmission part may be independently driven through connection thereof to different driving thin film transistors TFT1 and TFT2. As the zone of the transmission part also performs a light emission function during emission operation, it may be possible to enhance the emission efficiency in the entirety of the display device. In addition, it may be possible to increase the zone of the transmission part by limiting circuit regions of lines and thin film transistors within the zone of the emission part.

As apparent from the above description, the display device of the present invention has the following effects.

First, the display device of the present invention is provided with an organic light emitting element enabling light emission at a transmission part thereof having transparent substrates facing each other for transparent display and, as such, most regions of the display device may be used as an emission zone. Accordingly, it may be possible to solve the problem of a reduction in lifespan caused by continuous driving of the emission part alone in a transparent display device of a related art. That is, emission driving is enabled in most regions of the substrates and, as such, it may be possible to increase the lifespan of the display device because the current density per area is lowered.

Second, emission driving is enabled not only in the emission part, but also in the transmission part, and, as such, an enhancement in emission efficiency may be achieved.

Third, the electrode structure of the transmission part is a structure in which transparent electrodes face each other, differently from the electrode structure of the emission part. Accordingly, the transmission part may achieve transparent display.

Fourth, the organic light emitting element of the transmission part has a structure in which an optical compensation layer is provided between facing transparent electrode structures and, as such, is thicker than that of the emission part. Accordingly, it may be possible to enhance the impression of the color emitted from the transmission part.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device having an emission part and a transmission part, the display device comprising:
    a transparent substrate;
    a reflective anode on the transparent substrate in the emission part;
    a transparent anode on the transparent substrate in the transmission part;
    a first light emitting layer arranged on the reflective anode in the emission part;
    a second light emitting layer arranged on the transparent anode in the transmission part;
    a cathode arranged on both the first light emitting layer and the second light emitting layer,
    a first organic stack associated with the emission part and including the first light emitting layer between the reflective anode and the cathode; and
    a second organic stack associated with the transmission part and including the second light emitting layer between the transparent anode and the cathode,
    wherein the second organic stack comprises an optical compensation layer, the second organic stack being taller in height than the first organic stack, and
    wherein light emitted from the second light emitting layer is transmitted through both the cathode and the transparent anode in the transmission part.

2. The display device according to claim 1, further comprising:
    a first thin film transistor arranged outside the transmission part while being electrically connected to the reflective anode; and
    a second thin film transistor arranged outside the transmission part while being electrically connected to the transparent anode.

3. The display device according to claim 1, wherein:
    each of the first and second organic stacks comprises at least two sub-stacks separated by a charge generation layer;
    each sub-stack of the first organic stack is provided with the first light emitting layer; and
    each sub-stack of the second organic stack is provided with the second light emitting layer, and
    wherein at least one of the first and second organic stacks further comprises:
        a first common organic layer under the first and second light emitting layers of the two sub-stacks in the first and second organic stacks in common; and
        a second common organic layer over the first and second light emitting layers of the two sub-stacks in the first and second organic stacks in common.

4. The display device according to claim 3, wherein the optical compensation layer of the second organic stack contacts the second light emitting layer in at least one of the two sub-stacks.

5. The display device according to claim 3, wherein the optical compensation layer comprises the same material as at least one of organic layers included in the first common organic layer or the second common organic layer.

6. The display device according to claim 1, wherein the optical compensation layer included in the second organic stack has a total thickness of 400 Å to 1,200 Å.

7. The display device according to claim 1, wherein:
    the first light emitting layer comprises a first-color light emitting layer to emit light of a first wavelength and a second-color light emitting layer to emit light of a second wavelength; and
    the second light emitting layer comprises a third-color light emitting layer to emit light of a third wavelength different from the first wavelength and the second wavelength.

8. The display device according to claim 7, wherein:
    the first-color and second-color light emitting layers are alternately arranged while being spaced apart from each other; and
    each of the first-color and second-color light emitting layers is surrounded by a plurality of third-color light emitting layers spaced apart from one another.

9. The display device according to claim 7, wherein the third wavelength is longer than the first wavelength and shorter than the second wavelength.

10. The display device according to claim 1, wherein:
    the first light emitting layer comprises a first-color light emitting layer to emit light of a first wavelength, a second-color light emitting layer to emit light of a second wavelength, and a third-color light emitting layer to emit light of a third wavelength; and
    the second light emitting layer comprises a fourth color-light emitting layer to emit light of the third wavelength.

11. The display device according to claim 10, wherein the third wavelength is longer than the first wavelength and shorter than the second wavelength.

12. The display device according to claim 10, wherein the third-color light emitting layer and the fourth-color light emitting layer are electrically coupled to a same thin film transistor.

13. The display device according to claim 10, wherein:
    the first-color to third-color light emitting layers are spaced apart from one another; and
    the fourth-color light emitting layer is surrounded by the first-color to third-color light emitting layers and is spaced apart from the first-color to third-color light emitting layers.

14. The display device according to claim 13, wherein the third-color light emitting layer occupies a largest area in the emission part.

15. The display device according to claim 7, wherein the first wavelength is 430 nm to 490 nm, the third wavelength is 510 nm to 590 nm, and the second wavelength is 600 nm to 650 nm.

16. The display device according to claim 1, wherein the cathode comprises a metal alloy layer exhibiting a transmittance of 70% or more at a wavelength of 520 nm.

17. The display device according to claim 1, wherein:
the transparent anode comprises a layered structure having a first transparent electrode layer and a second transparent electrode layer; and
the reflective anode is in contact with a third transparent electrode layer and a fourth transparent electrode layer arranged respectively under and over the reflective anode of the emission part.

18. The display device according to claim 1, further comprising:
a color filter layer in the emission part over the cathode, to transmit light emitted from the first light emitting layer.

19. The display device according to claim 2, further comprising a capping layer on the cathode,
wherein the capping layer transmits light from the cathode corresponding to both the emission part and the transmission part when the first thin film transistor and the second thin film transistor are turned on.

* * * * *